(12) United States Patent
Park

(10) Patent No.: US 11,181,317 B2
(45) Date of Patent: Nov. 23, 2021

(54) TOUCH SENSING APPARATUS FOR METAL PANEL INCLUDING DISPLAY WINDOW WITH THROUGH-HOLES AND TOUCH PART, HOME APPLIANCE HAVING METAL PANEL AND TOUCH SENSING APPARATUS, AND METHOD FOR CONTROLLING THE SAME

(71) Applicant: LG Electronics Inc., Seoul (KR)

(72) Inventor: Seungje Park, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 16/785,401

(22) Filed: Feb. 7, 2020

(65) Prior Publication Data

US 2020/0173718 A1 Jun. 4, 2020

Related U.S. Application Data

(63) Continuation of application No. 16/375,509, filed on Apr. 4, 2019, now Pat. No. 10,619,915, which is a (Continued)

(30) Foreign Application Priority Data

Nov. 7, 2014 (KR) ........................ 10-2014-0154781

(51) Int. Cl.
*F25D 29/00* (2006.01)
*F25D 23/02* (2006.01)
(Continued)

(52) U.S. Cl.
CPC ........... *F25D 29/005* (2013.01); *F25D 23/02* (2013.01); *F25D 23/028* (2013.01);
(Continued)

(58) Field of Classification Search
CPC ...... F25D 29/005; F25D 29/006; F25D 29/00; F25D 23/02; F25D 23/028; F25D 23/00;
(Continued)

(56) References Cited

U.S. PATENT DOCUMENTS 4,056,699 A 11/1977 Jordan
5,923,522 A 7/1999 Sajna
(Continued)

FOREIGN PATENT DOCUMENTS

CN 1255665 6/2000
CN 1980061 6/2007
(Continued)

OTHER PUBLICATIONS

Extended European Search Report in European Appln. No. 19204794.2, dated Jul. 22, 2020, 11 pages.
(Continued)

*Primary Examiner* — Ryan A Lubit
(74) *Attorney, Agent, or Firm* — Fish & Richardson P.C.

(57) ABSTRACT

Provided is a metal touch sensing apparatus in which recognition performance thereof is improved, a plurality of touch parts are successively manipulated to enter into a specific mode, thereby preventing a refrigerator from being malfunctioned, and touch sensitivity of the refrigerator to be touched for the manipulation is visually adjusted, and a home appliance including the touch apparatus and a method for controlling the same.

10 Claims, 28 Drawing Sheets

Related U.S. Application Data continuation of application No. 15/305,261, filed as application No. PCT/KR2015/011956 on Nov. 6, 2015, now Pat. No. 10,330,380.

(51) Int. Cl.
| | | |
|---|---|---|
| *H03K 17/96* | (2006.01) | |
| *G06F 3/041* | (2006.01) | |
| *G06F 3/0488* | (2013.01) | |
| *G06F 3/045* | (2006.01) | |

(52) U.S. Cl.
CPC ......... *F25D 29/006* (2013.01); *G06F 3/0412* (2013.01); *G06F 3/0488* (2013.01); *H03K 17/962* (2013.01); *F25D 2201/126* (2013.01); *F25D 2400/361* (2013.01); *G06F 3/045* (2013.01); *H03K 2217/94031* (2013.01); *H03K 2217/96079* (2013.01); *H03K 2217/960705* (2013.01); *H03K 2217/960785* (2013.01)

(58) Field of Classification Search
CPC ......... F25D 2201/126; F25D 2400/361; F25D 2600/06; G06F 3/0412; G06F 3/0488; G06F 3/045; G06F 3/041; G06F 3/44; G06F 3/0416; H03K 2217/94031; H03K 17/96; H03K 17/962; H03K 17/9643; H03K 17/9647

See application file for complete search history.

(56) References Cited

U.S. PATENT DOCUMENTS

| | | | |
|---|---|---|---|
| 5,995,877 A | 11/1999 | Brueggemann et al. | |
| 6,242,076 B1 | 6/2001 | Andriash | |
| 6,265,682 B1 | 7/2001 | Lee | |
| 6,667,563 B2 | 12/2003 | Bae et al. | |
| 7,155,317 B1* | 12/2006 | Tran | H05B 47/13 |
| | | | 700/259 |
| 7,573,701 B2 | 8/2009 | Doberstein et al. | |
| 7,911,321 B2 | 3/2011 | Bingle et al. | |
| 8,371,551 B2 | 2/2013 | Jang | |
| 8,648,832 B2 | 2/2014 | Maloof et al. | |
| 8,742,647 B2 | 6/2014 | Fluhrer | |
| 8,922,979 B2 | 12/2014 | Fluhrer | |
| 9,323,289 B2 | 4/2016 | Oohira | |
| 10,007,385 B2 | 6/2018 | Kim et al. | |
| 2002/0066971 A1* | 6/2002 | Takashi | B29C 45/844 |
| | | | 264/40.1 |
| 2003/0043449 A1 | 3/2003 | Takeuchi et al. | |
| 2004/0100479 A1* | 5/2004 | Nakano | G06F 3/0362 |
| | | | 715/700 |
| 2006/0177212 A1 | 8/2006 | Lamborghini et al. | |
| 2006/0262549 A1 | 11/2006 | Schmidt | |
| 2007/0051610 A1 | 3/2007 | Weiss | |
| 2007/0130965 A1 | 6/2007 | Boarman et al. | |
| 2007/0246267 A1 | 10/2007 | Koottungal | |
| 2008/0143684 A1 | 6/2008 | Seo | |
| 2008/0165154 A1 | 7/2008 | Kim | |
| 2008/0196945 A1* | 8/2008 | Konstas | G06F 3/0443 |
| | | | 178/18.03 |
| 2008/0257706 A1 | 10/2008 | Haag | |
| 2009/0033635 A1 | 2/2009 | Wai | |
| 2009/0128375 A1 | 5/2009 | Heimann et al. | |
| 2009/0306827 A1 | 12/2009 | Kim | |
| 2009/0322700 A1* | 12/2009 | D'Souza | G06F 3/04883 |
| | | | 345/174 |
| 2010/0007531 A1 | 1/2010 | Fluhrer | |
| 2010/0114011 A1* | 5/2010 | Herrmann | A61M 5/16854 |
| | | | 604/25 |
| 2010/0149000 A1 | 6/2010 | Heimann | |
| 2010/0216929 A1 | 8/2010 | Jung et al. | |
| 2010/0219176 A1 | 9/2010 | Streigler | |
| 2011/0032199 A1 | 2/2011 | Seo | |
| 2011/0048047 A1 | 3/2011 | Kim | |
| 2011/0267304 A1* | 11/2011 | Simmons | G06F 3/0446 |
| | | | 345/174 |
| 2012/0138336 A1 | 6/2012 | Watanabe et al. | |
| 2012/0138337 A1 | 6/2012 | Kim | |
| 2012/0274602 A1 | 11/2012 | Bita et al. | |
| 2013/0021274 A1* | 1/2013 | Fukushima | H03K 17/9622 |
| | | | 345/173 |
| 2013/0067940 A1* | 3/2013 | Shim | H04L 12/2827 |
| | | | 62/125 |
| 2013/0082948 A1 | 4/2013 | Ok | |
| 2014/0101589 A1 | 4/2014 | Hyun et al. | |
| 2014/0203863 A1 | 7/2014 | Gillespie | |
| 2014/0300263 A1 | 10/2014 | Sung | |
| 2015/0002451 A1 | 1/2015 | Um | |
| 2015/0192352 A1* | 7/2015 | Sung | F25D 23/028 |
| | | | 62/125 |
| 2015/0276302 A1 | 10/2015 | Roh et al. | |
| 2015/0378514 A1* | 12/2015 | Keski-Jaskari | G01L 1/16 |
| | | | 345/178 |
| 2016/0105985 A1* | 4/2016 | Wang | H05K 7/14 |
| | | | 361/810 |
| 2016/0117022 A1 | 4/2016 | Kim et al. | |
| 2016/0253020 A1 | 9/2016 | Frey | |
| 2017/0024049 A1 | 1/2017 | Tachikawa | |

FOREIGN PATENT DOCUMENTS

| | | |
|---|---|---|
| CN | 101535748 | 9/2009 |
| CN | 101738051 | 6/2010 |
| CN | 101741371 | 6/2010 |
| CN | 101939605 | 1/2011 |
| CN | 102338544 | 2/2012 |
| CN | 202582565 | 12/2012 |
| CN | 103105979 | 5/2013 |
| CN | 103109135 | 5/2013 |
| CN | 105546930 | 5/2016 |
| CN | 105577156 | 5/2016 |
| EP | 2770638 | 2/2013 |
| EP | 2975345 | 1/2016 |
| EP | 3007361 | 4/2016 |
| JP | S58014433 | 1/1983 |
| JP | 06095803 | 4/1994 |
| JP | H06095803 | 4/1994 |
| JP | H06060031 | 8/1994 |
| JP | 2006250485 | 9/2006 |
| JP | 2007100995 | 4/2007 |
| JP | 2011090897 | 5/2011 |
| JP | 2012098828 | 5/2012 |
| JP | 2013057432 | 3/2013 |
| JP | 2014031958 | 2/2014 |
| JP | 201455700 | 3/2014 |
| JP | 2014040939 | 3/2014 |
| JP | 2014043982 | 3/2014 |
| JP | 201485024 | 5/2014 |
| JP | 2014196933 | 10/2014 |
| KR | 100756451 | 8/2007 |
| KR | 20090090518 | 8/2009 |
| KR | 20100074034 | 7/2010 |
| KR | 20120011516 | 2/2012 |
| KR | 20120048655 | 5/2012 |
| KR | 20120116207 | 10/2012 |
| KR | 20140121753 | 10/2014 |
| WO | WO2008069352 | 6/2008 |
| WO | WO2010001556 | 1/2010 |
| WO | WO2010015749 | 2/2010 |
| WO | WO2014034434 | 3/2014 |
| WO | WO2014208585 | 12/2014 |
| WO | WO2015128990 | 3/2017 |

OTHER PUBLICATIONS

Chinese Office Action in Chinese Application No. 201510671495.5, dated Jul. 3, 2017, 10 pages (with English translation).

Chinese Office Action in Chinese Application No. 201510684487.4, dated Jul. 3, 2017, 26 pages (with English translation).

(56) References Cited

OTHER PUBLICATIONS

Chinese Office Action in Chinese Application No. 201510964492.0, dated Jan. 17, 2018, 6 pages (with partial English translation).
Chinese Office Action in Chinese Application No. 201510977160.6, dated Sep. 29, 2017, 10 pages (with English translation).
Chinese Office Action in Chinese Application No. 201510977666.7, dated Oct. 25, 2017, 18 pages (with English translation).
Chinese Office Action in Chinese Application No. 201510979959.9, dated Jan. 25, 2018, 5 pages (with partial English translation).
Chinese Office Action in Chinese Application No. 201580024096.8, dated Jul. 27, 2018, 27 pages.
European Extended Search Report in European Application No. 15856232.2, dated Jun. 20, 2018, 12 pages.
European Extended Search Report in European Application No. 18158905.2, dated Jun. 19, 2018, 8 pages.
International Search Report dated Mar. 2, 2016 for Application No. PCT/KR2015/011956, 2 pages.
Office Action in European Application No. 15191174.0, dated Sep. 18, 2018, 6 pages.
United States Final Office Action in U.S. Appl. No. 14/931,776, dated Aug. 8, 2018, 28 pages.
United States Office Action in U.S. Appl. No. 14/977,605, dated Nov. 17, 2017, 43 pages.
United States Office Action in U.S. Appl. No. 14/977,588, dated Feb. 5, 2019, 20 pages.
United States Office Action in U.S. Appl. No. 14/977,605, dated May 25, 2018, 12 pages.
United States Office Action in U.S. Appl. No. 14/977,588, dated Jul. 25, 2018, 32 pages.
United States Office Action in U.S. Appl. No. 16/199,992, dated Jan. 11, 2019, 24 pages.
United States Office Action in U.S. Appl. No. 15/358,226, dated Apr. 23, 2019, 43 pages.
United States Office Action in U.S. Appl. No. 14/931,776, dated Feb. 28, 2018, 18 pages.
United States Office Action in U.S. Appl. No. 14/931,776, dated Mar. 24, 2017, 36 pages.
United States Office Action in U.S. Appl. No. 14/931,776, dated Sep. 5, 2017, 18 pages.

* cited by examiner

[Fig. 1]
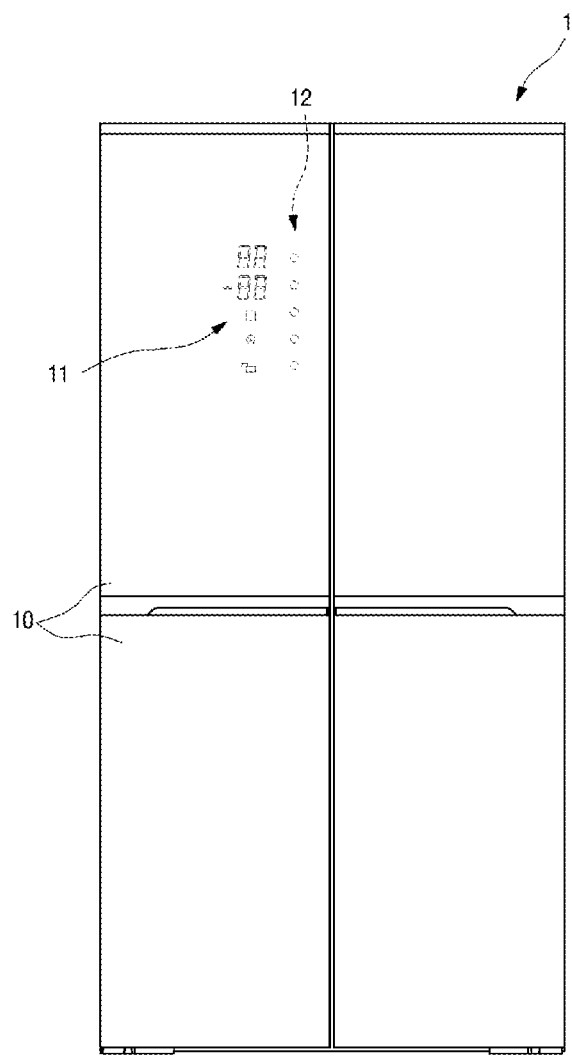

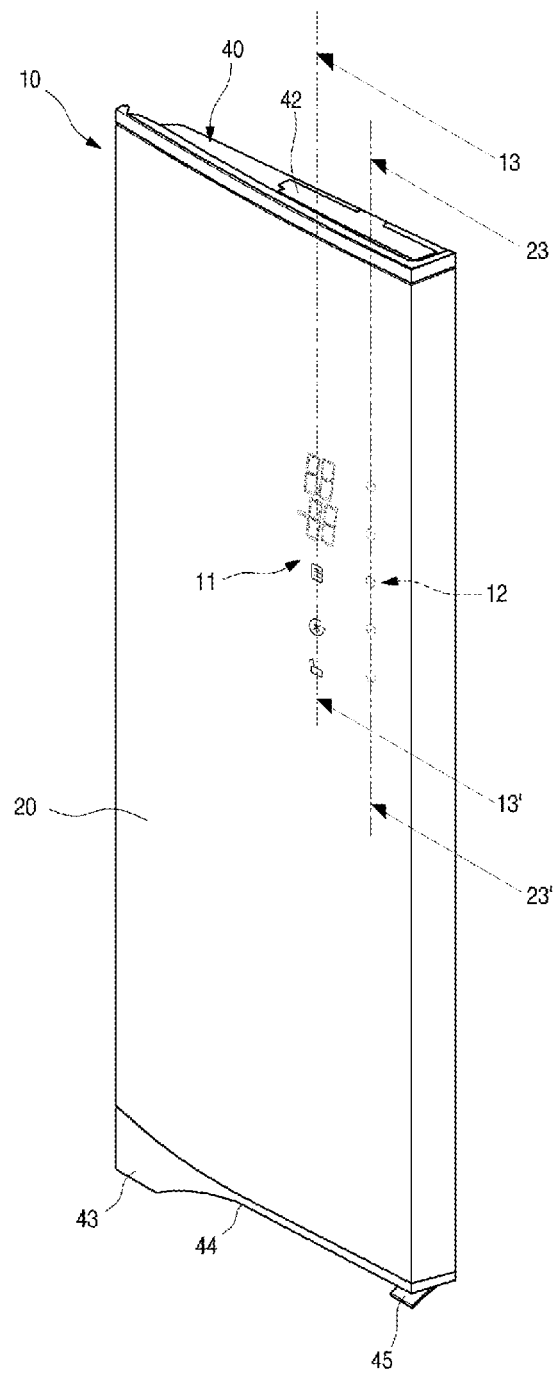
[Fig. 2]

[Fig. 3]
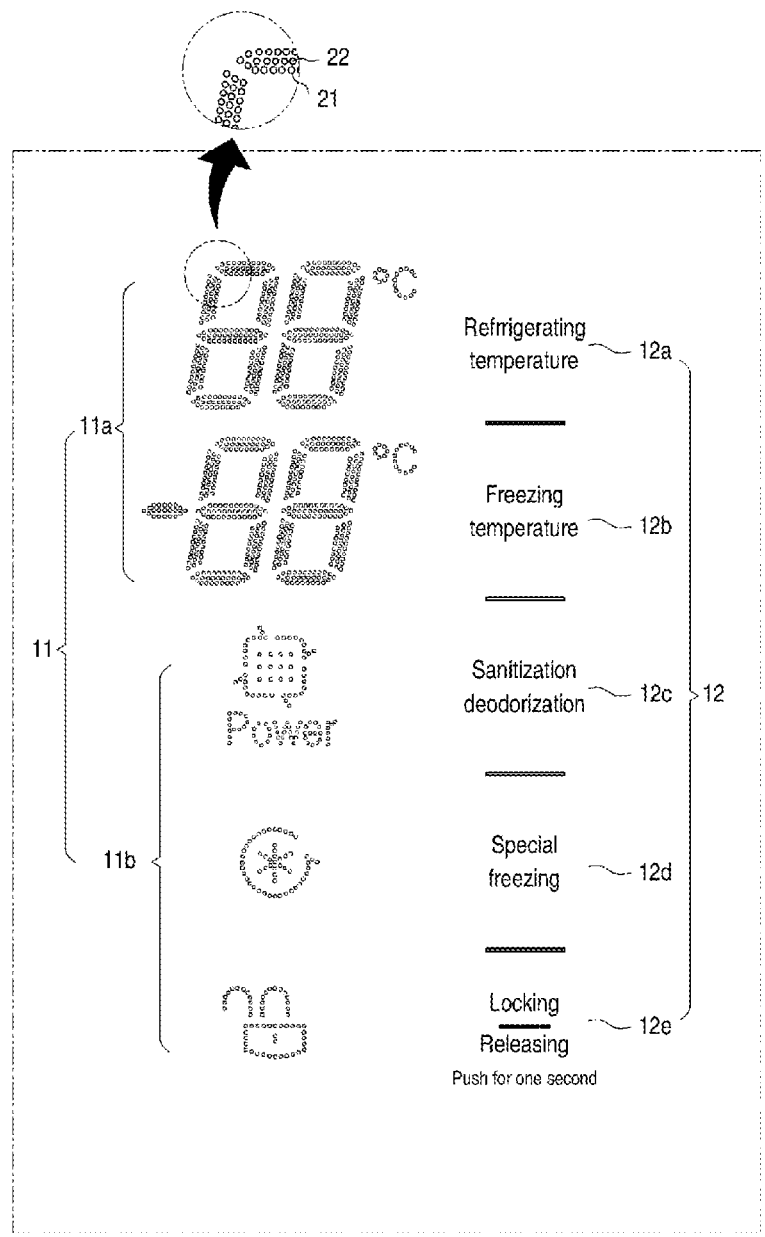

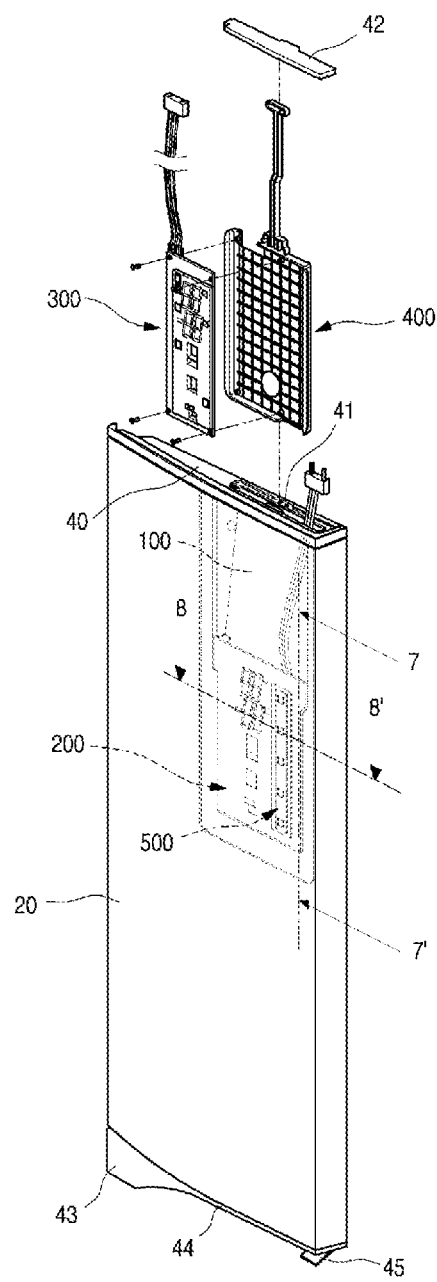
[Fig. 4]

[Fig. 5]
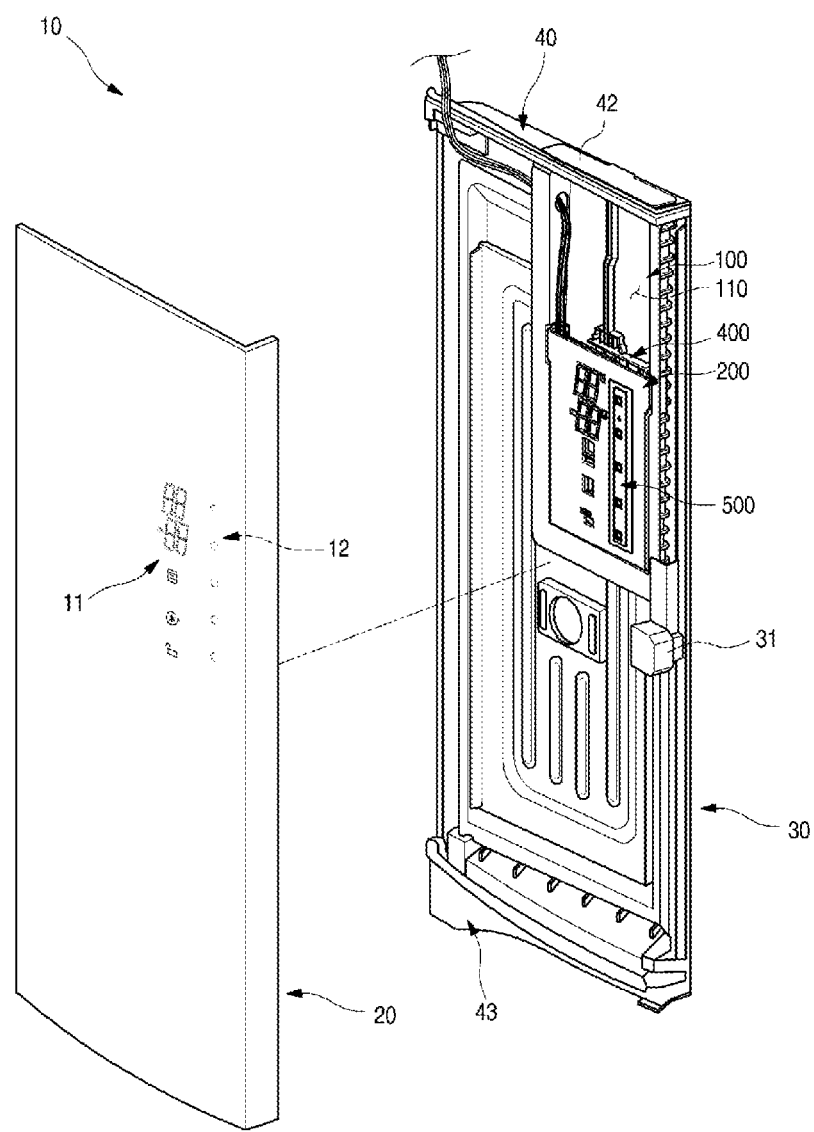

[Fig. 6]
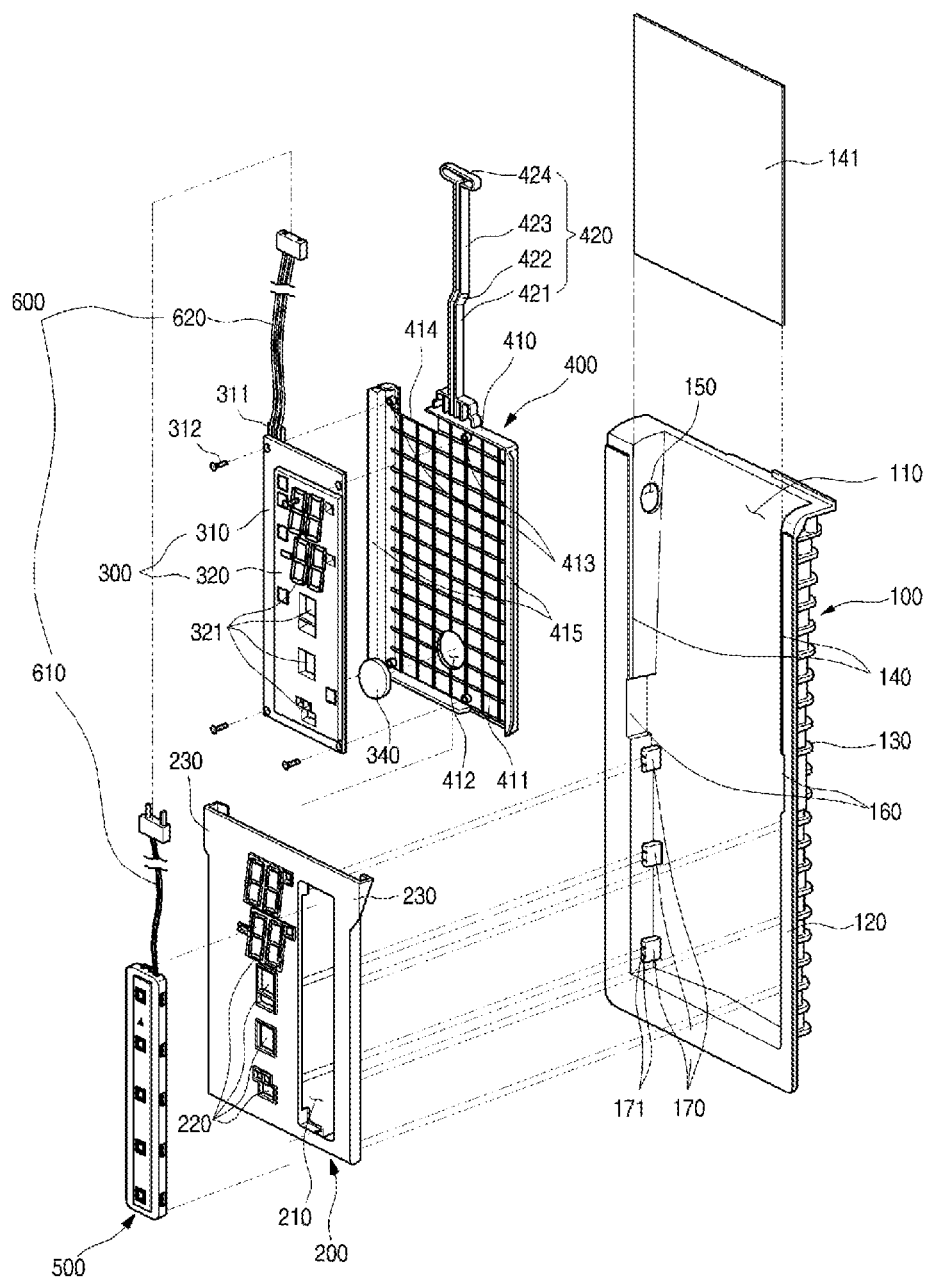

[Fig. 7]
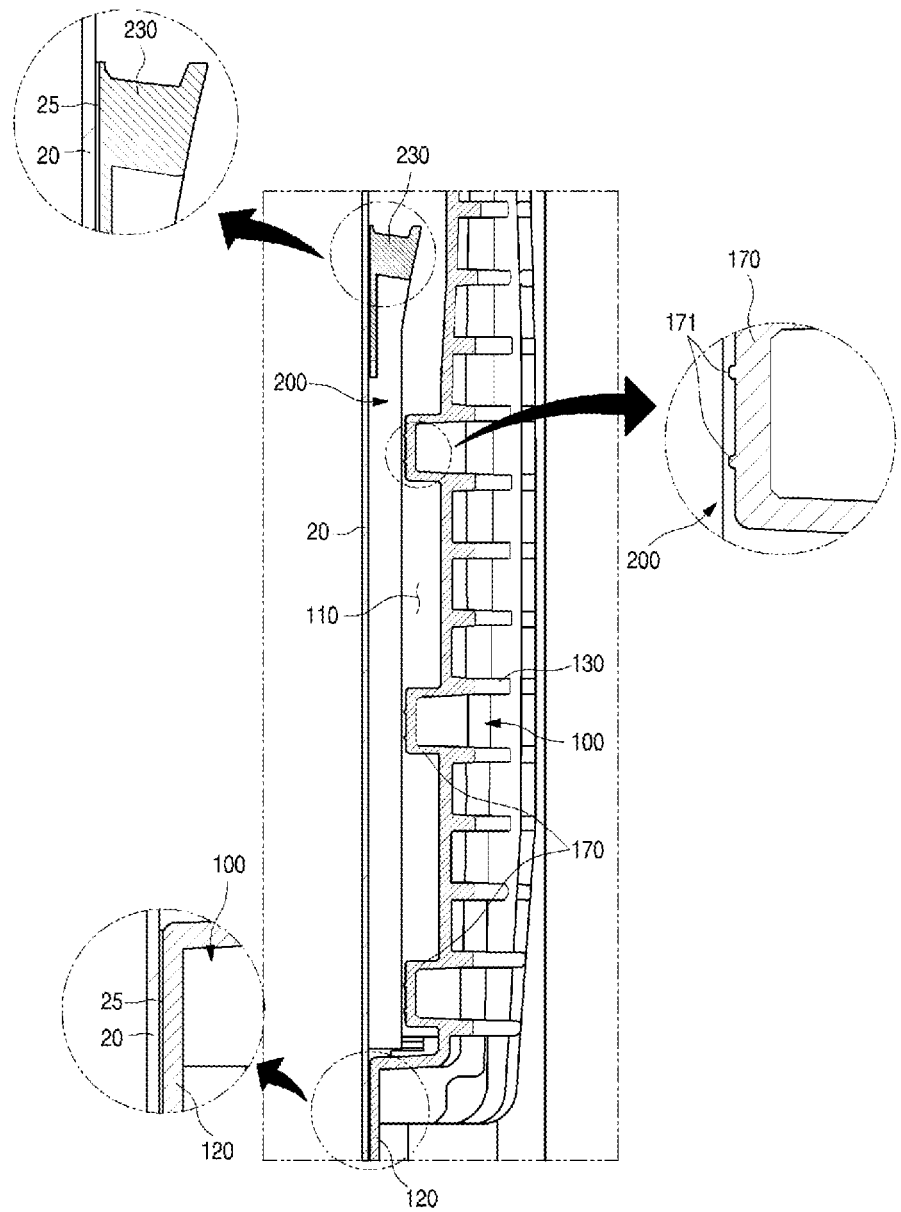
[Fig. 8]
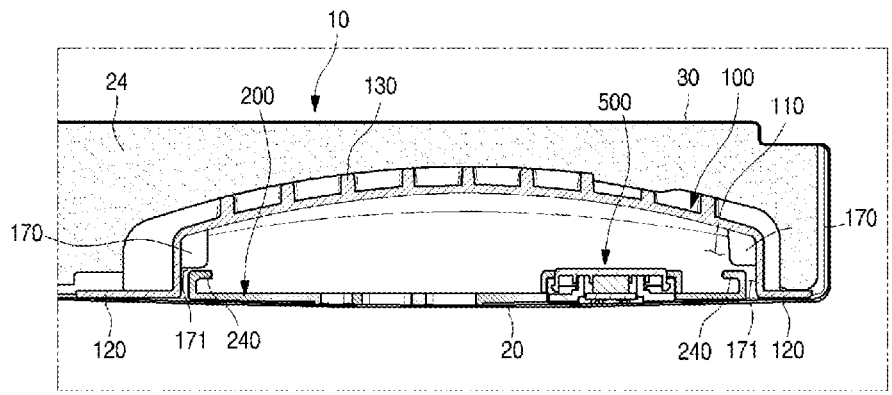

[Fig. 9]
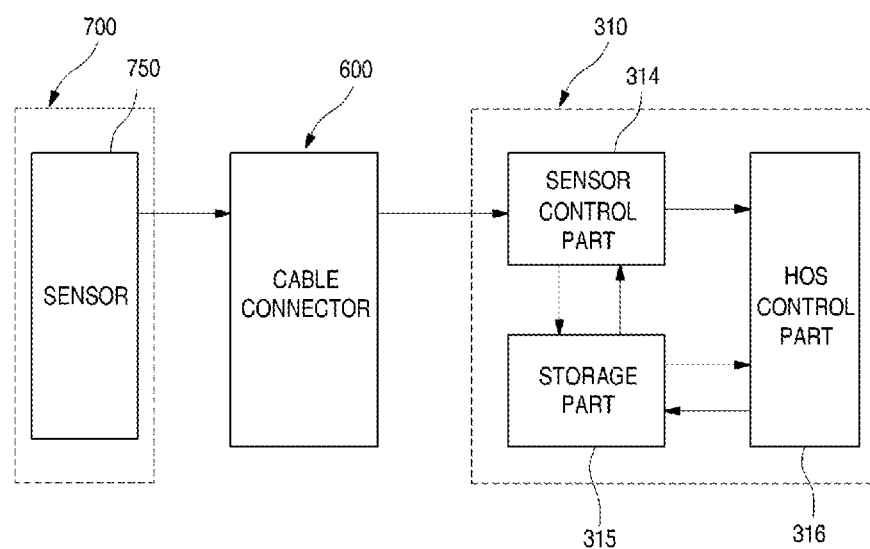

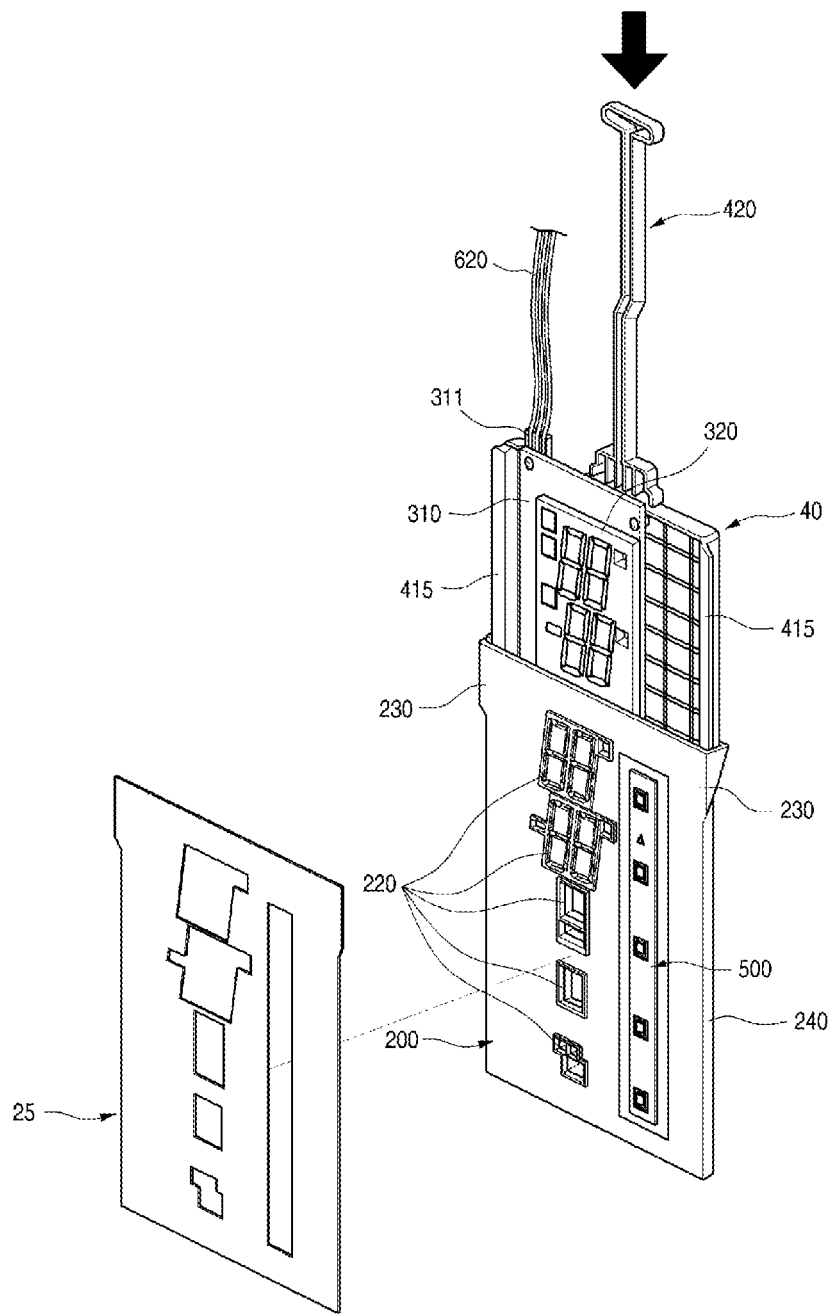
[Fig. 10]

[Fig. 11]
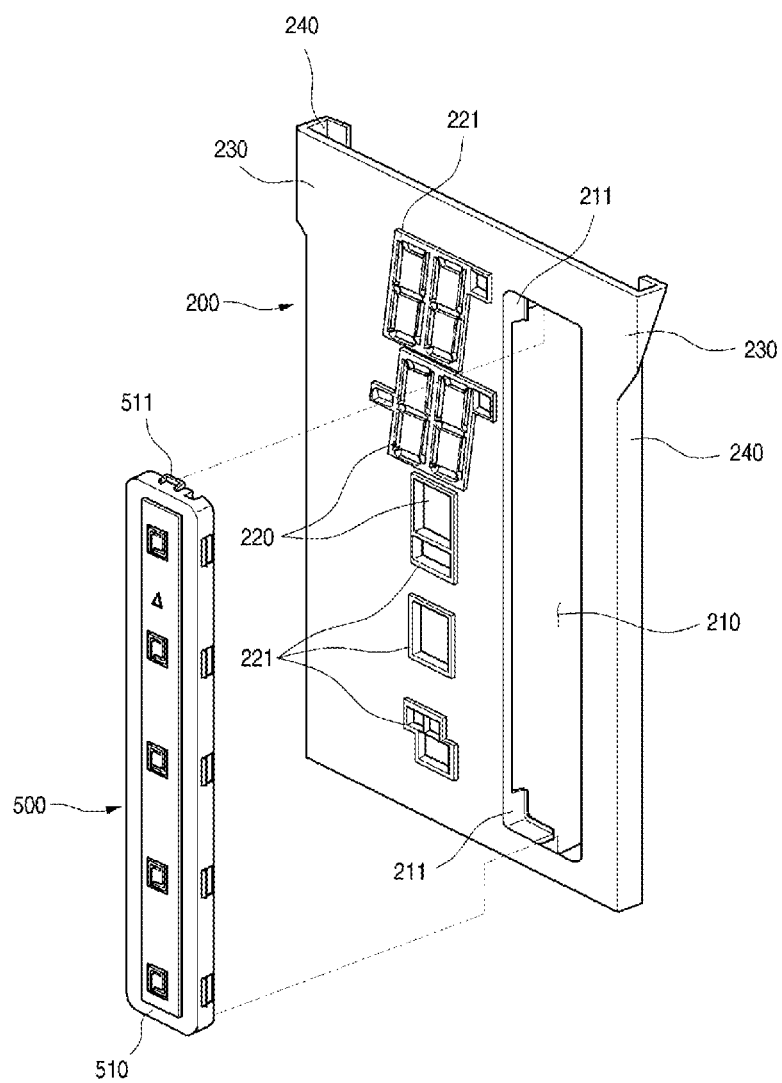

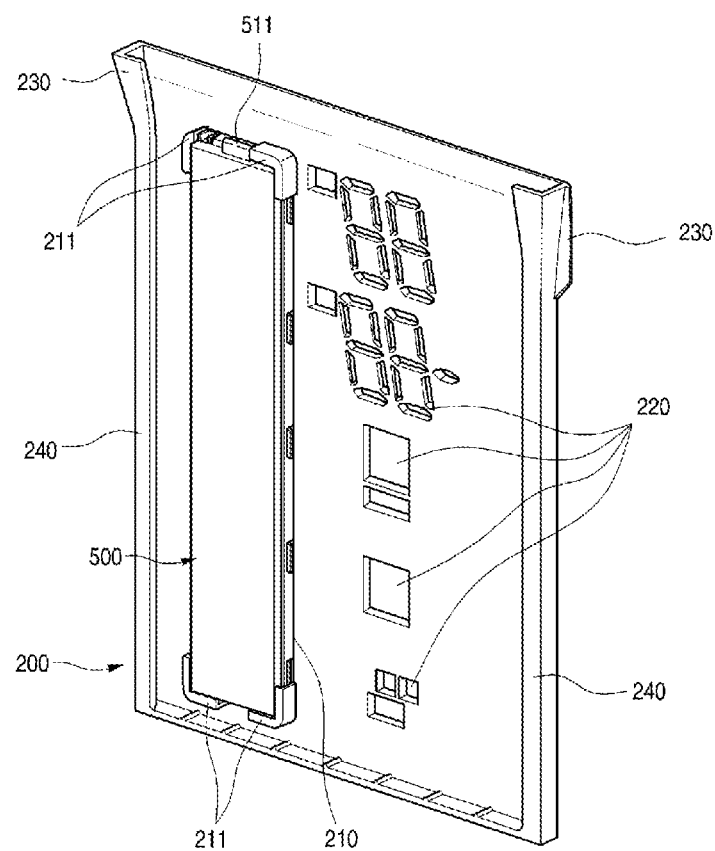
[Fig. 12]

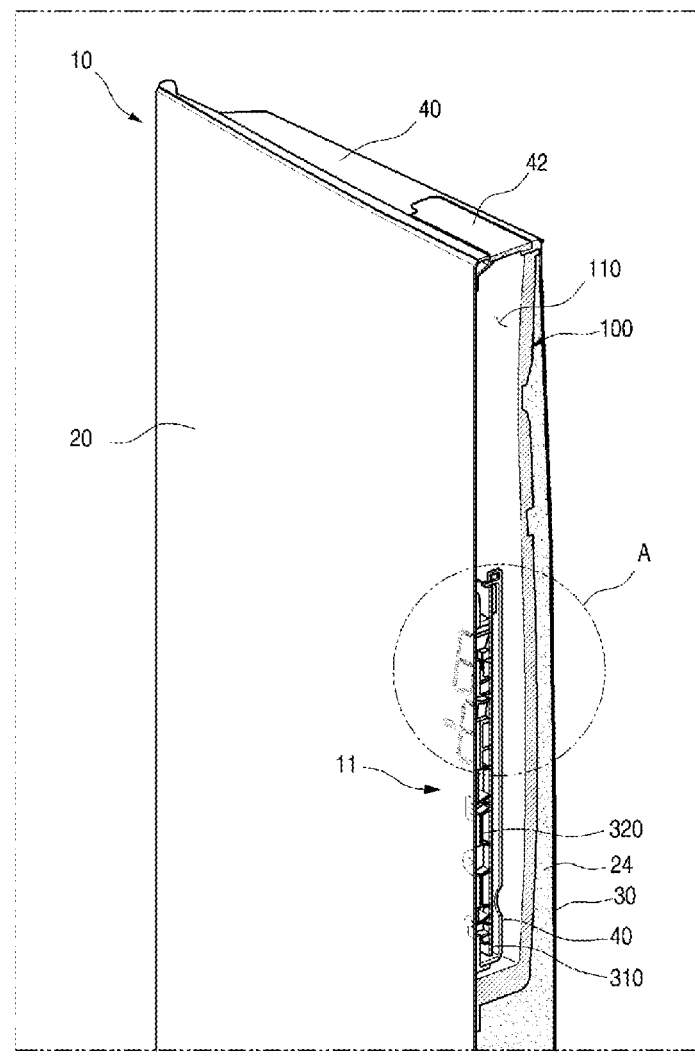
[Fig. 13]

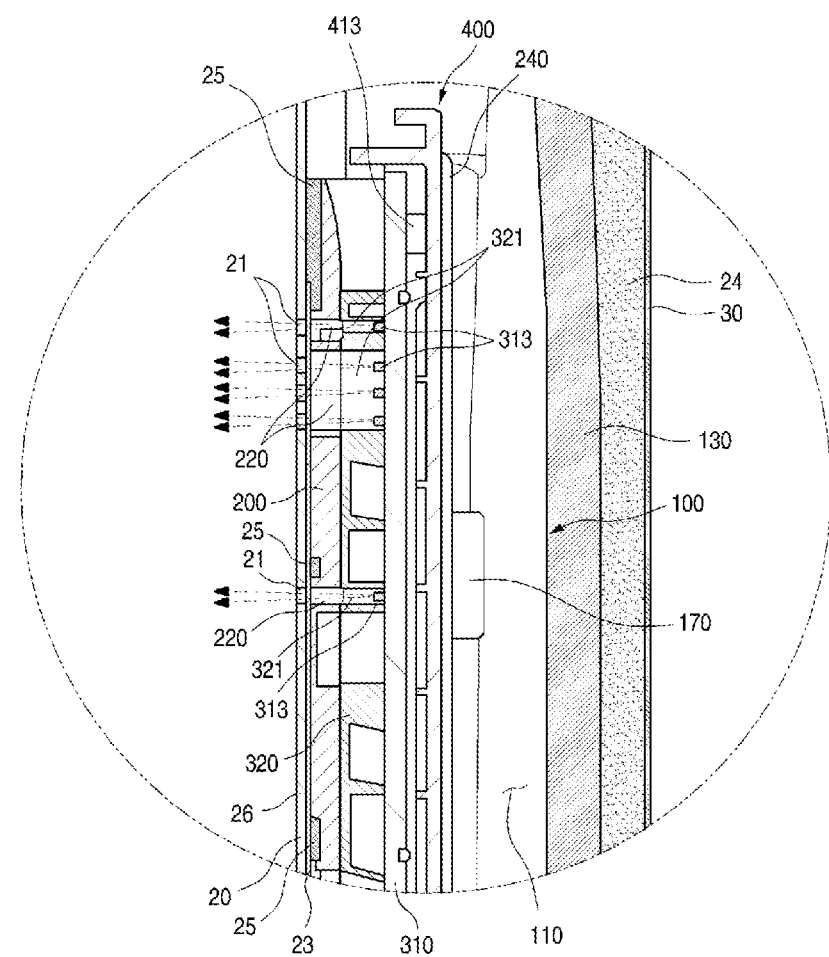
[Fig. 14]

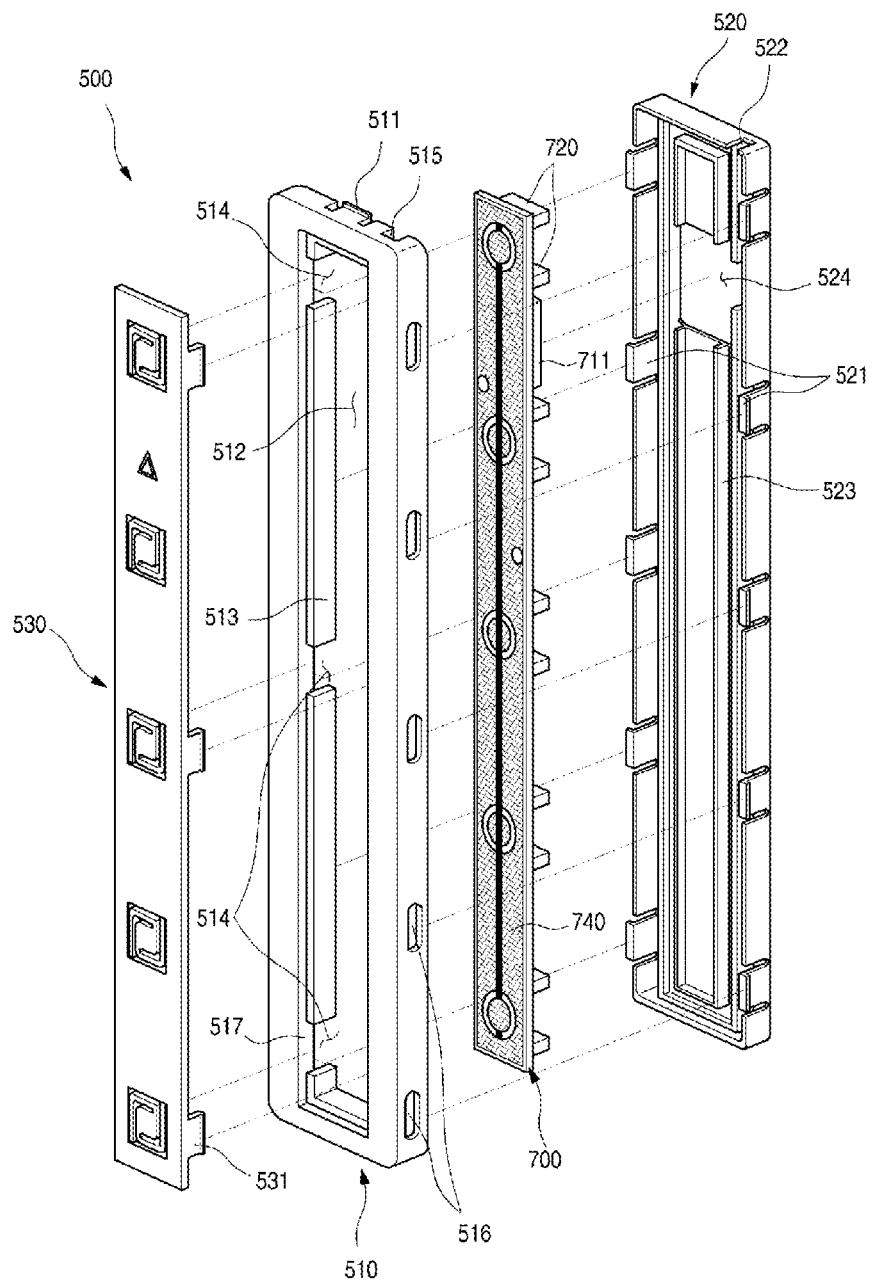
[Fig. 15]

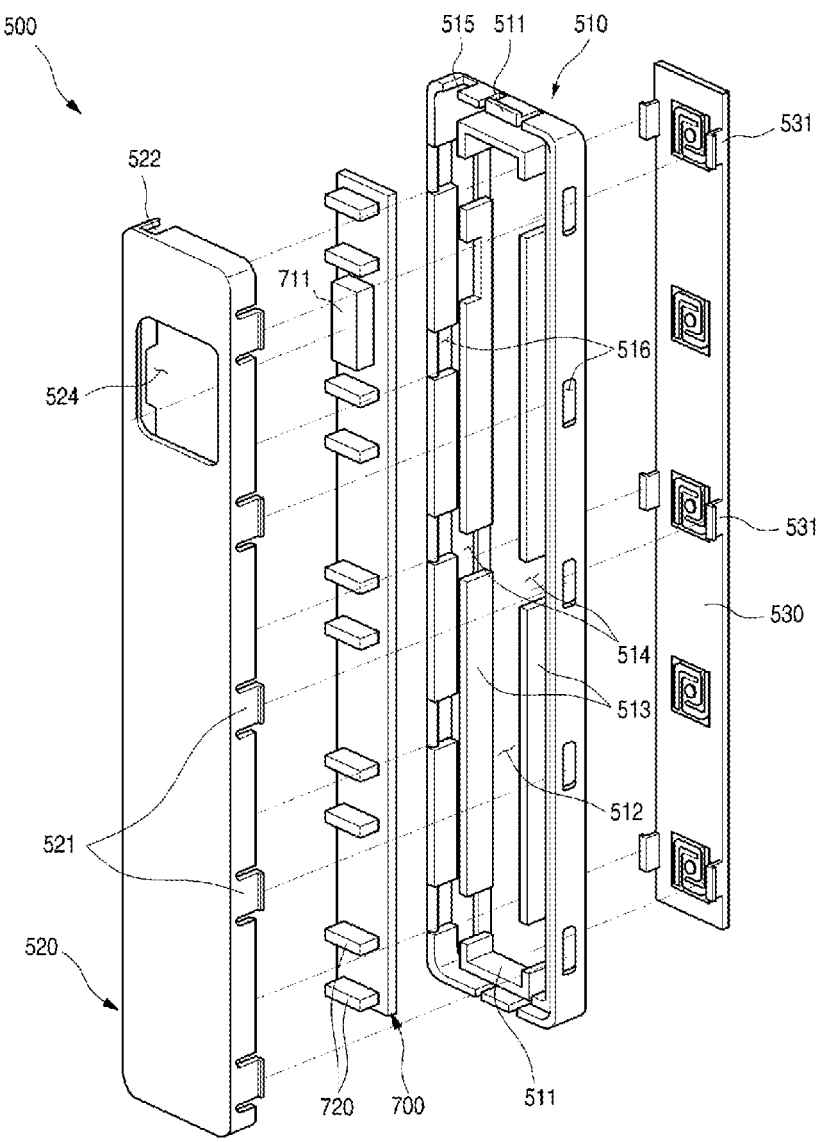
[Fig. 16]

[Fig. 17]
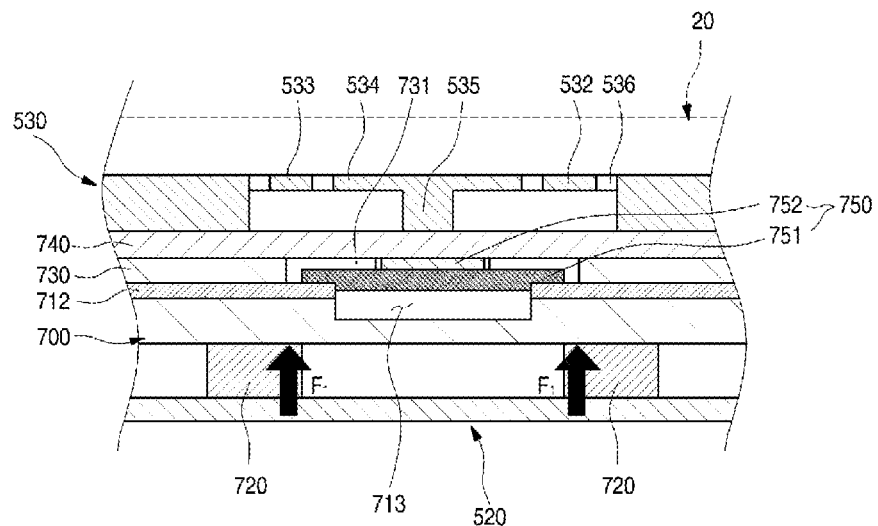
[Fig. 18]
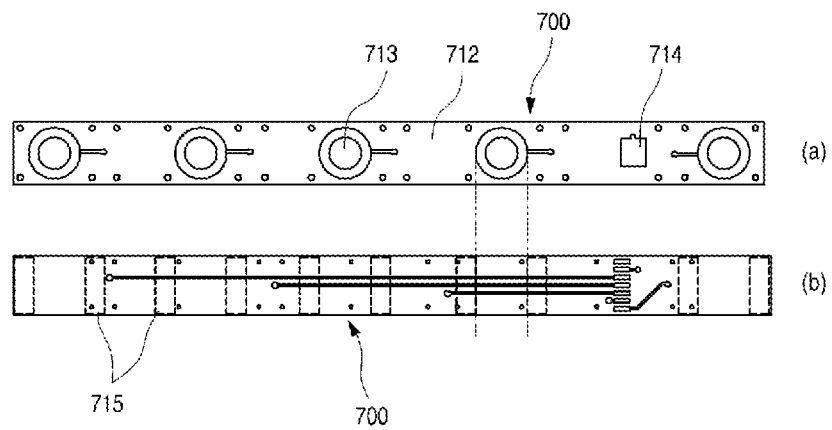
[Fig. 19]
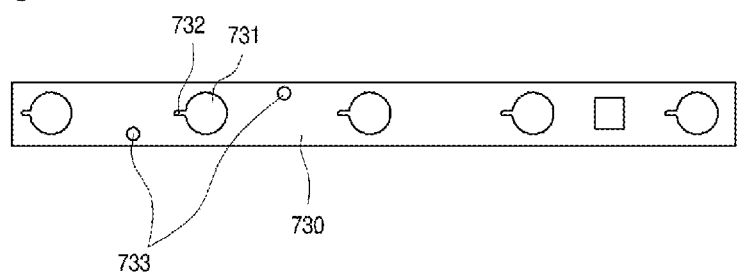

[Fig. 20]
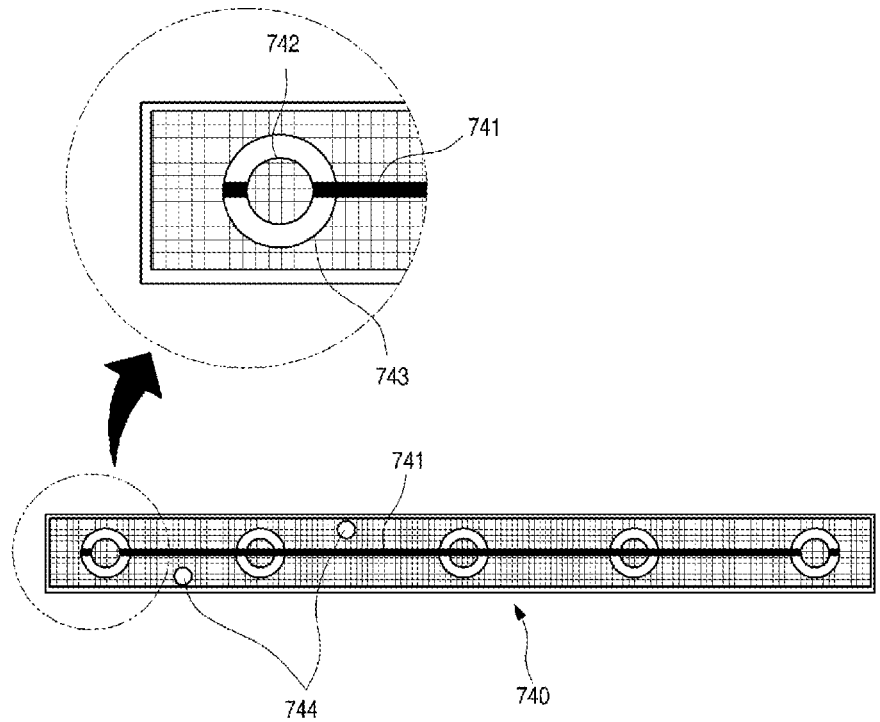
[Fig. 21]
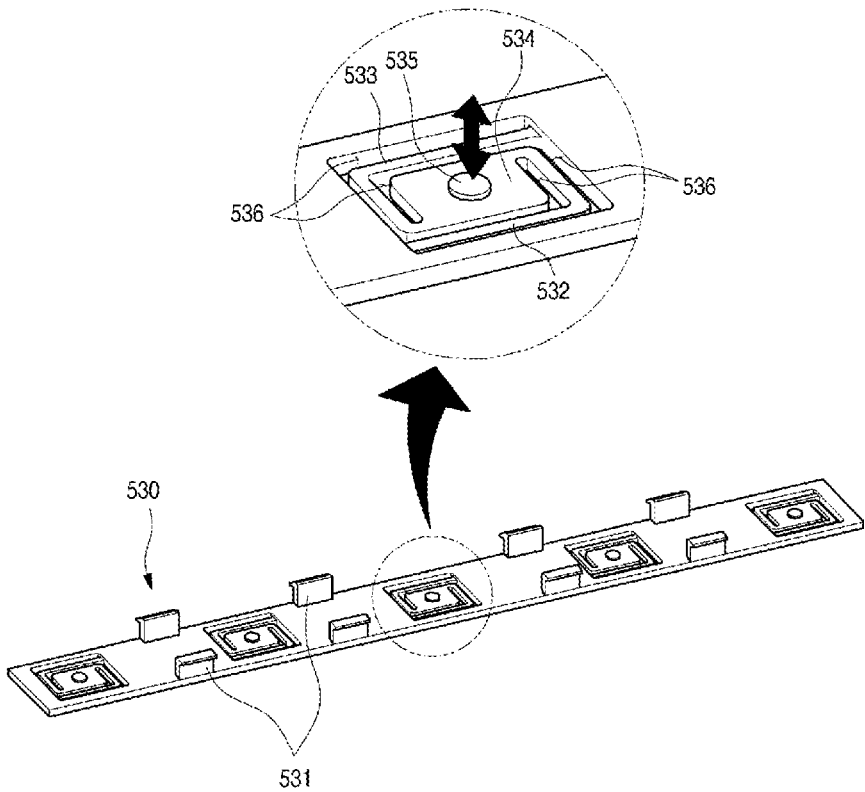

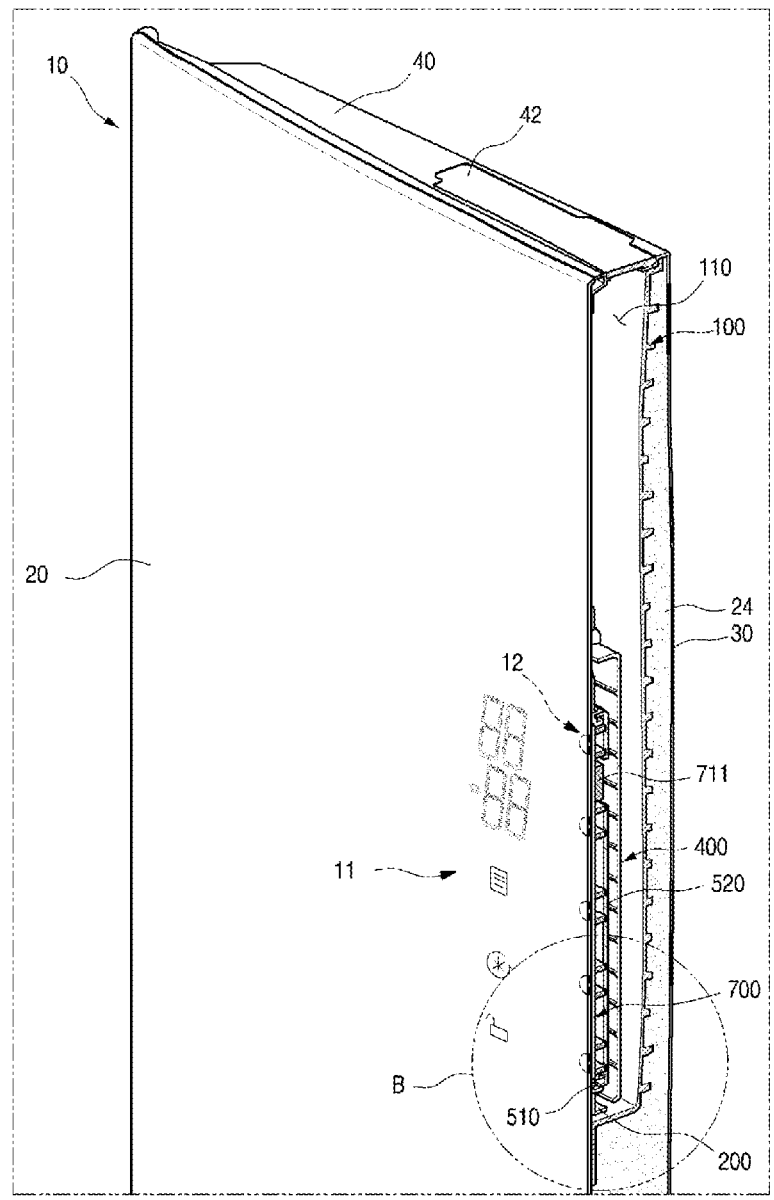
[Fig. 22]

[Fig. 23]
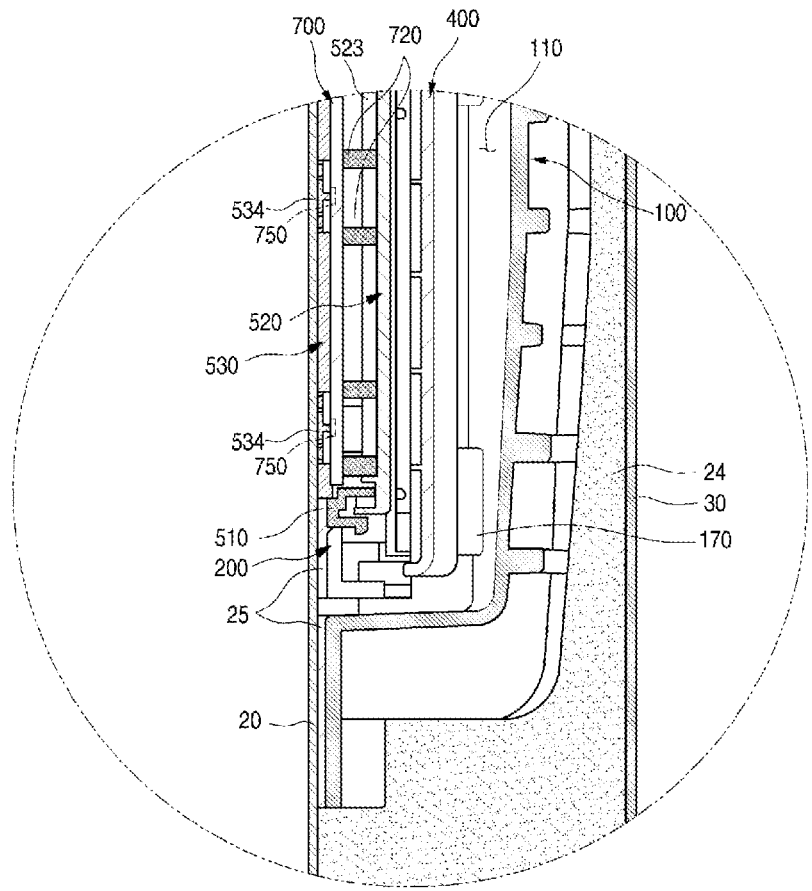
[Fig. 24]
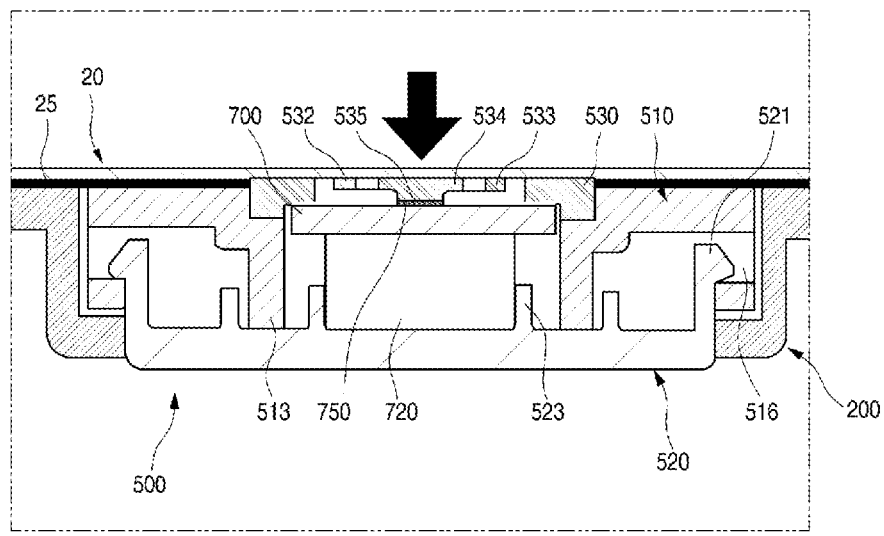

[Fig. 25]
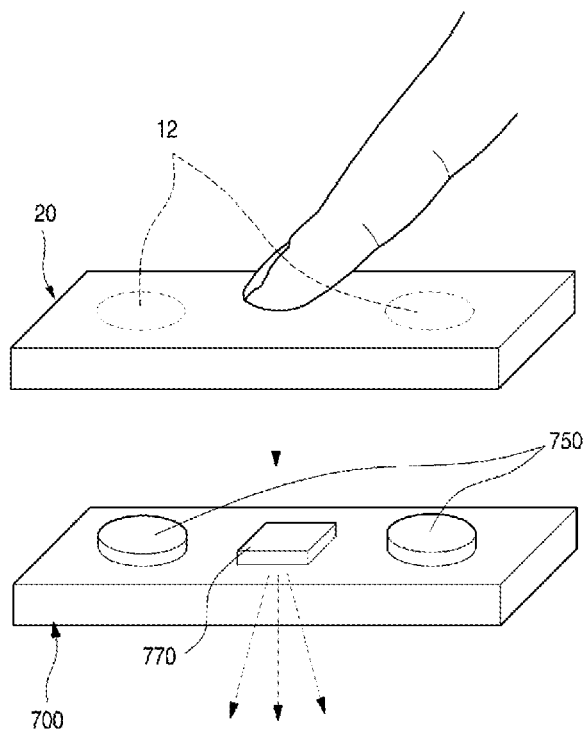
[Fig. 26]
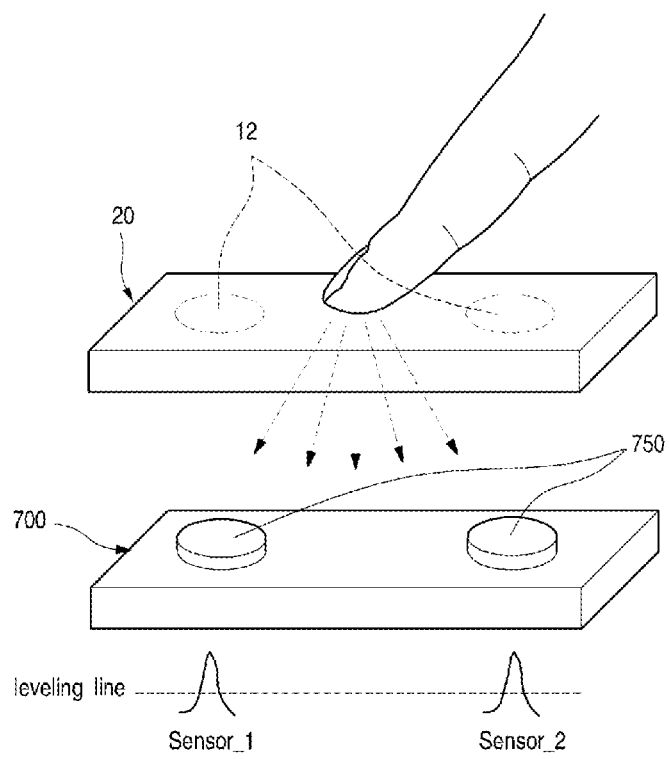

[Fig. 27]
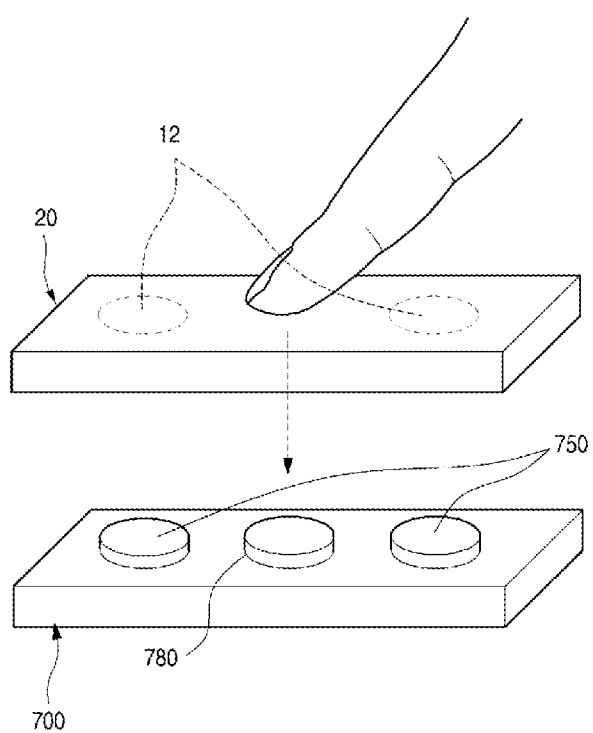

[Fig. 28]
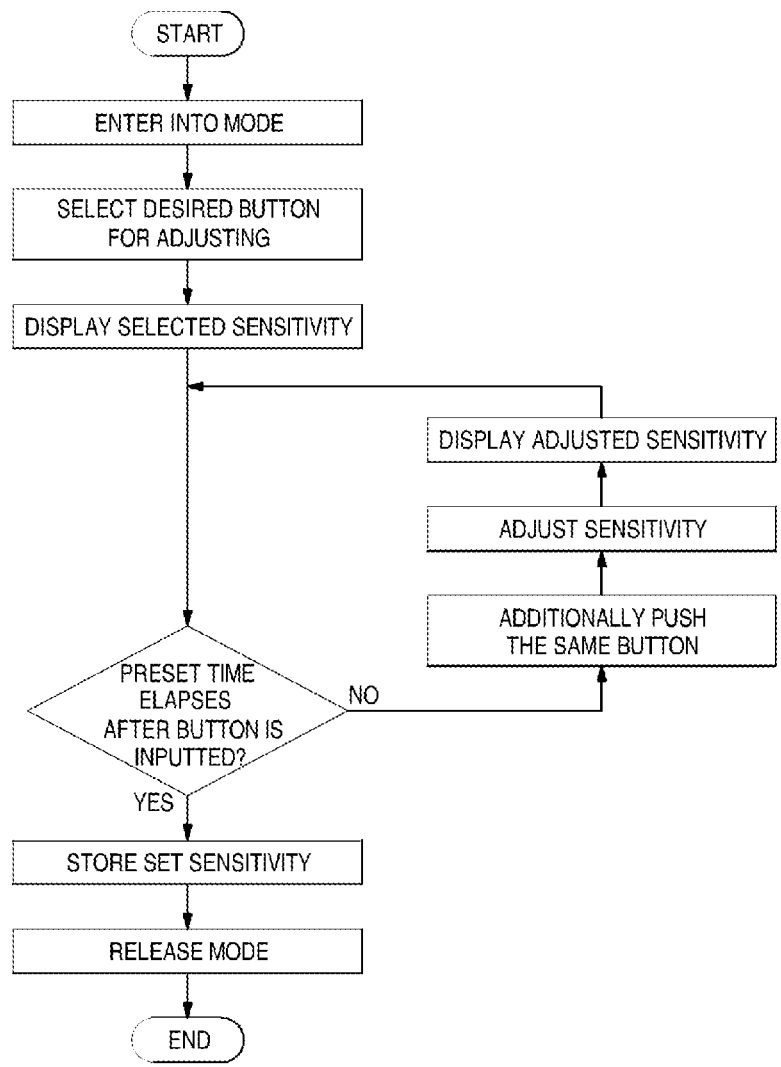

[Fig. 29]
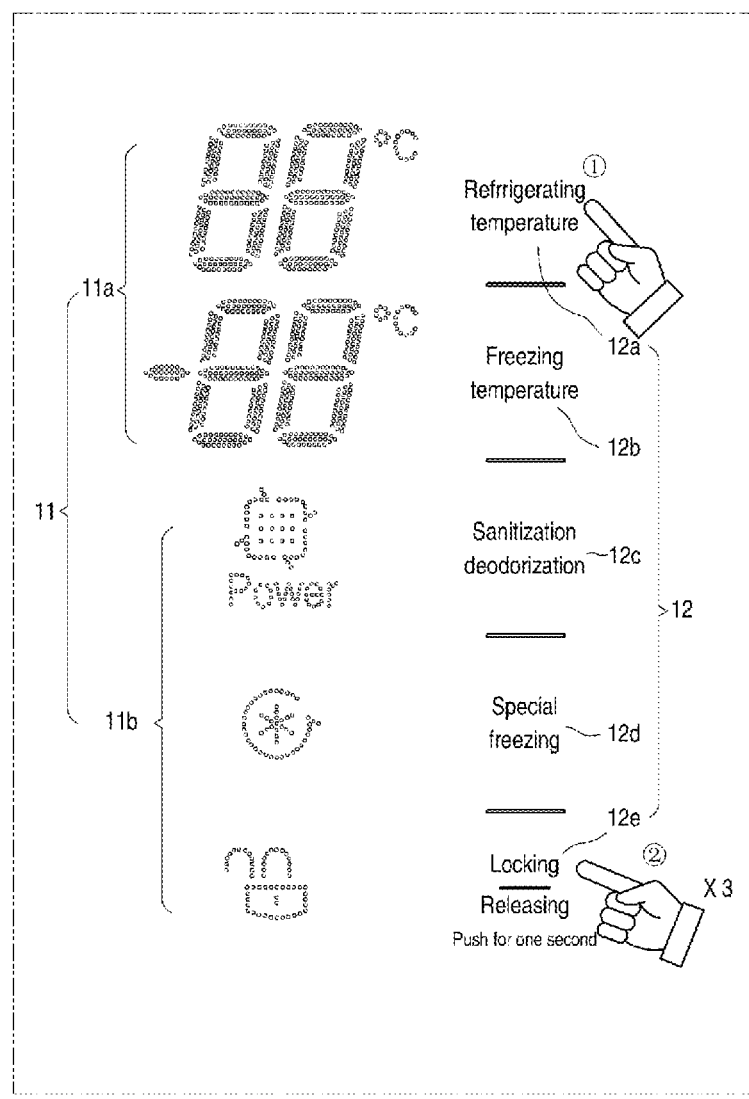

[Fig. 30]
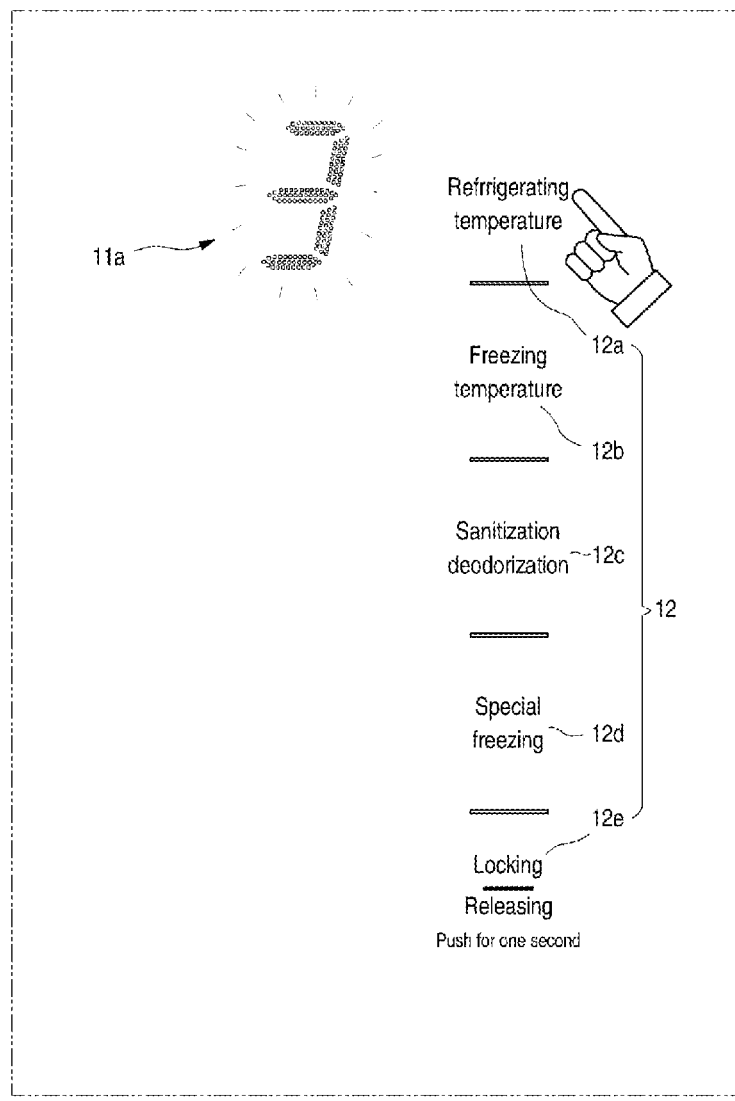

[Fig. 31]
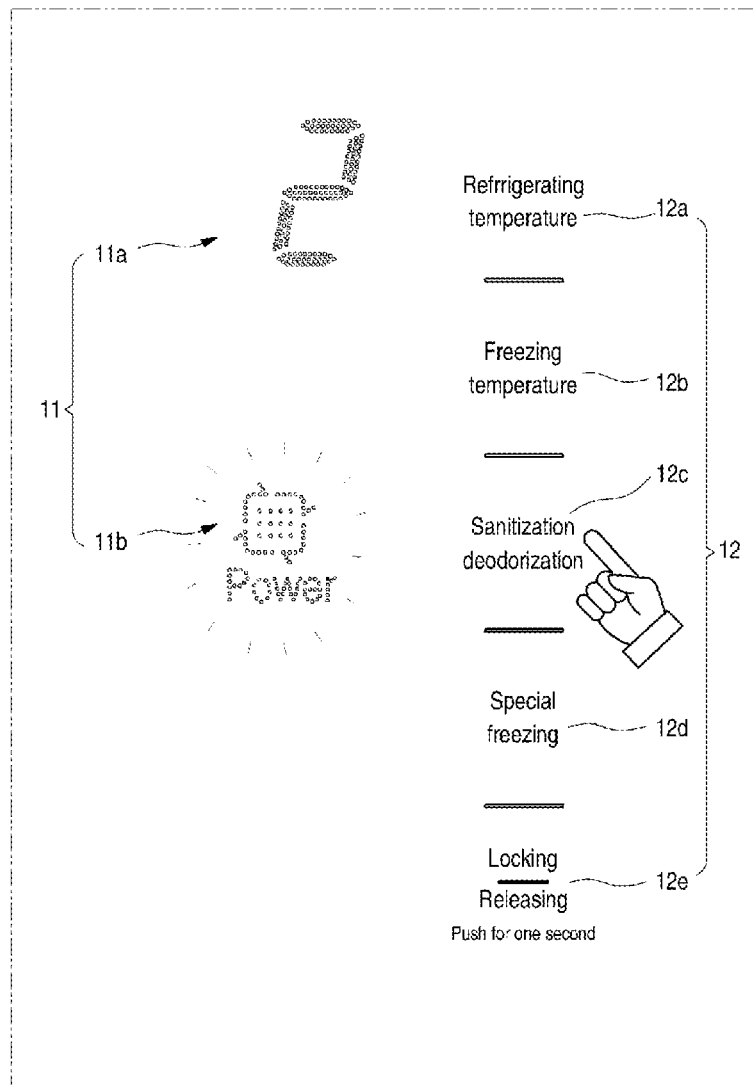
[Fig. 32]
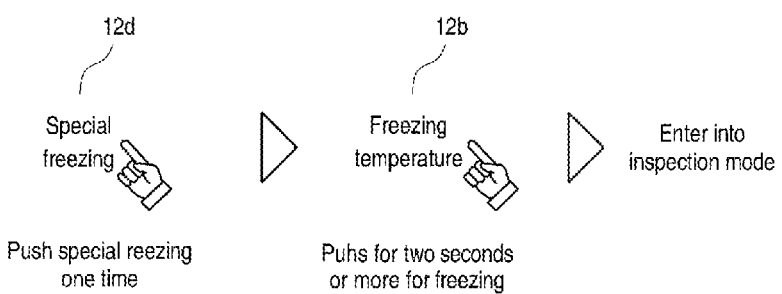

[Fig. 33]
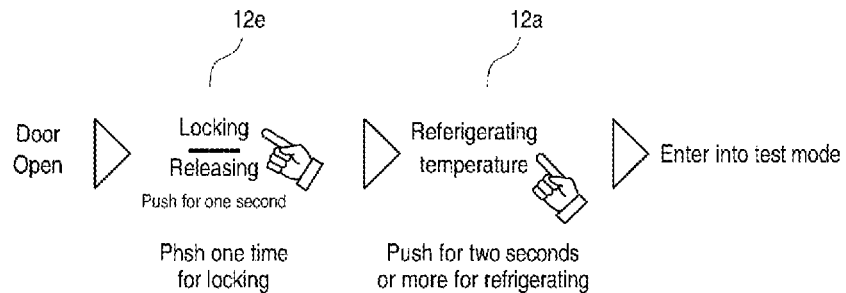
[Fig. 34]
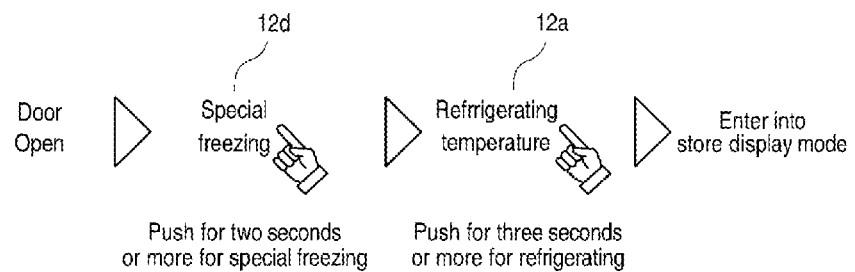

[Fig. 35]
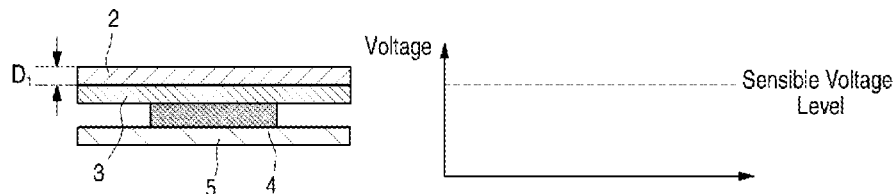
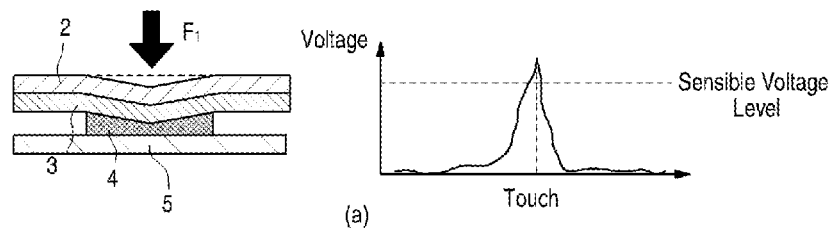
(a)
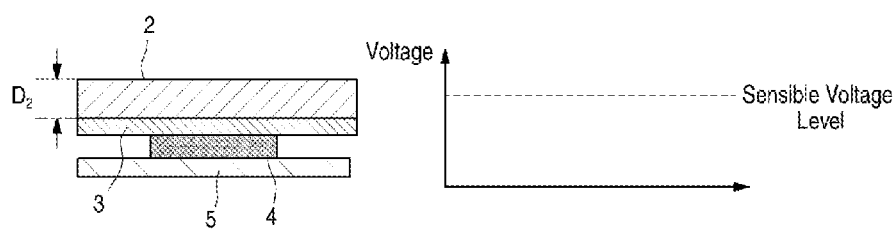
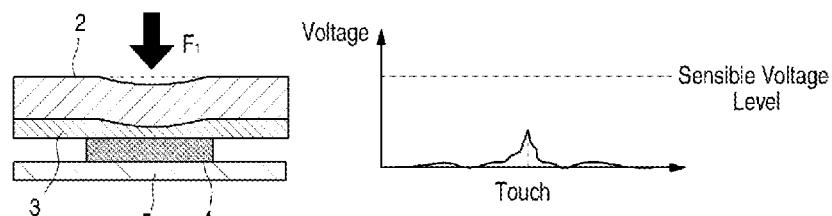
$D_1 < D_2$ (b)

[Fig. 36]
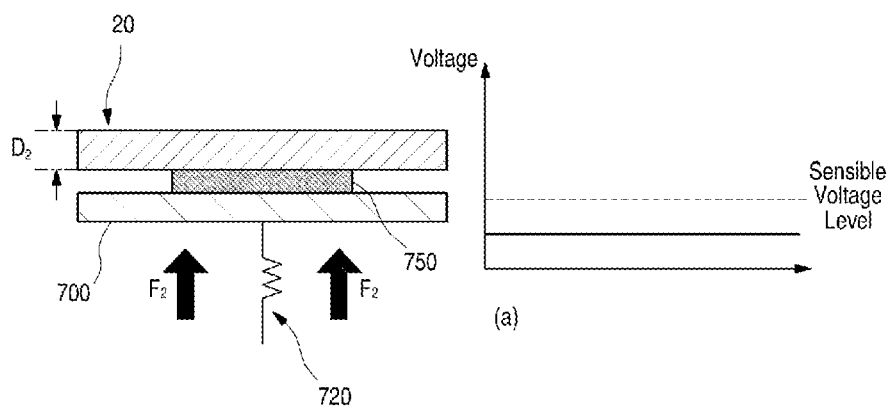
(a)
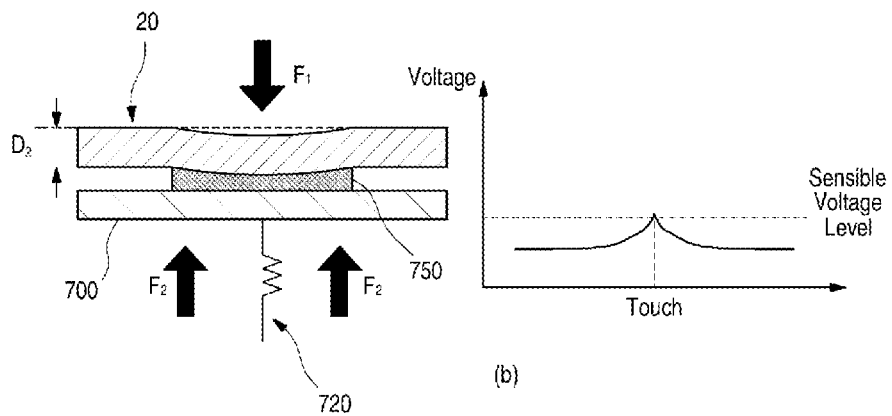
(b)

TOUCH SENSING APPARATUS FOR METAL PANEL INCLUDING DISPLAY WINDOW WITH THROUGH-HOLES AND TOUCH PART, HOME APPLIANCE HAVING METAL PANEL AND TOUCH SENSING APPARATUS, AND METHOD FOR CONTROLLING THE SAME

CROSS-REFERENCE TO RELATED APPLICATIONS

Pursuant to 35 U.S.C. § 119(e), this application is a continuation of U.S. application Ser. No. 16/375,509, filed on Apr. 4, 2019, which is a continuation of U.S. application Ser. No. 15/305,261, filed on Oct. 19, 2016, now U.S. Pat. No. 10,330,380, which is a National Stage application under 35 U.S.C. § 371 of International Application No. PCT/KR2015/011956, filed on Nov. 6, 2015, which claims the benefit of Korean Application No. 10-2014-0154781, filed on Nov. 7, 2014. The disclosures of the prior applications are incorporated by reference in their entirety.

TECHNICAL FIELD

The present disclosure relates to a metal touch sensing apparatus, and a home appliance having the metal touch sensor apparatus and a method for controlling the same.

BACKGROUND ART

In general, a touch sensor assembly that is used for home appliances recognizes a pushing operation of a user to generate a signal for operating a home appliance. The touch sensor assembly includes a capacitive sensor and a resistance cell type sensor. The sensors may detect touch of the user to convert the user's touch into a signal for operating the home appliance.

In the recent home appliances, exterior members of the home appliances may be formed of steel or glass or coated with a material similar to the steel or glass to improve outer appearances of the home appliances. A touch sensor assembly for recognizing touch of the exterior members when the exterior members are touched is being also developed.

Refrigerators are home appliances for storing foods at a low temperature in a storage space that is covered by a door. The refrigerator cools the inside of the storage space using cool air generated by heat-exchanging with a refrigerant that circulates a cooling cycle to store the foods in an optimum state.

The inside of the refrigerator may be classified into a refrigerating compartment and a freezing compartment. Accommodation members such as shelves, drawers, and baskets may be disposed within the refrigerating compartment and the freezing compartment. Also, each of the refrigerating compartment and the freezing compartment may be closed by a door. The refrigerator is classified into various types according to positions of the refrigerator compartment and the freezer compartment and configurations of the doors.

Recently, as the tendency of high-quality and multifunctional refrigerator increases, refrigerators having improved outer appearances and various equipment for convenience are introduced. For example, refrigerators in which an external member that defines an outer appearance is formed of steel or glass or coated with a material similar to the steel or glass, and displays and manipulation devices having various structures are adopted are being developed. A refrigerator according to the related art is disclosed in Korean Patent Registration No. 10-0634365.

It is necessary to enter into a special mode that is not a general manipulation mode so as to inspect a product in a production line after the refrigerator is completely assembled or check or manage the refrigerator when a service situation occurs during the use by a user. The special mode may have an influence on an operation of the refrigerator. To prevent manipulation due to user's carelessness from occurring, a manipulation part may not have a general manipulation shape, but have a shape in which a plurality of buttons have to be pushed at the same time. Alternatively, a button through which separate reset or special mode entry is enabled may be provided at a position except for the position at which the manipulation part is disposed.

The above references are incorporated by reference herein where appropriate for appropriate teachings of additional or alternative details, features and/or technical background.

DISCLOSURE OF INVENTION

Technical Problem

Embodiments provide a metal touch sensing apparatus which is capable of sensitively sensing user's touch manipulation on a panel formed of a metal material.

Embodiments also provide a metal touch sensing apparatus which is capable of generating a sensible voltage, even though touch manipulation is performed at small force, by increasing a base voltage to improve sensitivity of a touch sensor.

Embodiments also provide a metal touch sensing apparatus in which a touch sensor has a base voltage of about 0V or more before user's touch manipulation to sense the touch manipulation in spite of a small pressure change during the touch manipulation.

Embodiments also provide a metal touch sensing apparatus which is capable of being attached to a panel defining an outer appearance of a home appliance, into which a foaming solution is injected.

Embodiment also provide a metal touch sensing apparatus which is capable of accurately sensing touch manipulation on a metal panel having a thickness that is enough to endure a foam pressure.

Embodiments also provide a home appliance in which a plurality of touch parts are successively manipulated to enter into a specific mode, thereby preventing the home appliance from being malfunctioned and a method for controlling the same.

Embodiments also provide a home appliance to be manipulated through touch, of which touch sensitivity is visually adjusted and a method for controlling the same.

Solution to Problem

In one embodiment, a metal touch sensing apparatus includes: a touch sensor directly contacting a rear surface of a panel formed of a metal material; and an elastic member for generating force which pushes the touch sensor toward the panel.

The touch sensor may include a piezoelectric device or a resistive cell type device.

In another embodiment, a metal touch sensing apparatus includes: a touch part for performing user's pushing manipulation on a panel formed of a metal material, which defines an outer appearance of a home appliance; and an elastic member disposed so that a front surface of the touch sensor contacts a rear surface of the touch part, the elastic member being disposed at a rear side of the touch sensor to generate force which pushes the touch sensor toward the touch part.

An adhesive may be applied to the rear surface of the panel except for the touch part.

In further another embodiment, a refrigerator includes: a panel formed of a metal material, the panel defining a front surface of a refrigerator door into which a foaming solution is injected; a touch part disposed on the panel to perform user's touch or pushing manipulation thereon; and a touch sensor assembly disposed between the touch part and the foaming solution, wherein the touch sensor assembly includes: a touch sensor disposed to allow a device to contact a rear surface of the touch part; and an elastic member disposed at a rear side of the touch sensor to generate force which pushes the touch sensor toward the touch part.

In further another embodiment, a refrigerator door includes: an insulation material formed by injecting a foaming solution into the refrigerator door; a panel defining an outer appearance of the door and formed of a metal material with a thickness of about 0.4 mm to about 1.0 mm to prevent the door from being deformed by a foaming pressure and on which a touch part for performing user's touch or pushing manipulation thereon; a touch apparatus disposed between the touch part and the insulation material to accurately detect the pushing or touch manipulation on the touch part.

The touch apparatus may be disposed to allow the device of the touch sensor to directly contact a rear surface of a manipulation part of the panel, and an elastic member generating force which pushes the touch sensor toward the touch part is disposed at a rear side of the touch sensor.

The touch sensor may detect the touch on the touch part by using a piezoelectric device or a resistive cell type device.

The elastic member may be mounted on a sensor PCB on which the touch sensor is mounted.

In further another embodiment, a metal touch sensing apparatus includes: a front panel defining an outer appearance of a front surface thereof and on which a touch part is disposed, the front panel being formed of a metal material; a sensor PCB mounted on a position corresponding to the touch part on a rear surface of the front panel and on which a touch sensor for detecting touch of the front panel is mounted; an elastic member contacting a rear surface of the sensor PCB to press and support the sensor PCB in a direction of the touch part, the elastic member generating a base voltage in the touch sensor in a no-touch state; and a sensor control part detecting a voltage increasing from the base voltage when a touch operation occurs to recognize that the touch operation occurs when the increasing voltage is greater than a preset value.

In further another embodiment, a home appliance includes: a front panel including a window and a touch part, the front panel defining an outer appearance of the home appliance; a display mounted on a rear surface of the window of the front panel; a plurality of touch sensors mounted on a rear surface of the touch part of the front panel; a sensor control part comparing signals transmitted from the plurality of touch sensors with a preset value; a storage part storing set values of the plurality of touch sensors; and a host control part displaying the set values changed by user's manipulation on the display to provide the changed set values to the storage part.

In further another embodiment, a method for setting touch sensitivity of a home appliance includes: touching a plurality of different points within a preset time on a manipulation part formed on a front panel forming an outer appearance of the home appliance to allow a plurality of touch sensors mounted on a rear surface of a touch part to be converted into a touch sensitivity setting mode; touching a touch point disposed at a front side of the touch sensor, in which touch sensitivity resetting is desired, of the plurality of touch sensors; controlling a display disposed at a rear side of the front panel to display the set touch sensitivity of the touch sensor, in which the touch sensitivity resetting is desired, through a display window of the front panel; and touching a touch point disposed at a front side of the touch sensor, in which the touch sensitivity resetting is desired, to change the touch sensitivity.

In further another embodiment, a refrigerator includes: a front panel formed of a metal material to define an outer appearance of a refrigerator door and on which a touch part for user's touch manipulation is disposed; an insulation material filled into the refrigerator door, the insulation material being formed by a foaming solution; a touch sensor assembly disposed between the front panel of the refrigerator and the insulation material to detect the touch manipulation; and a sensor control part detecting a voltage increasing from a base voltage when a touch operation occurs to recognize that the touch operation occurs when the increasing voltage is greater than a preset value, wherein the touch sensor assembly includes: a touch sensor contacting the touch part to detect a displacement of the front panel when the touch manipulation occurs; a sensor PCB on which the touch sensor is mounted; and an elastic member disposed on the sensor PCB to press and support the sensor PCB so that the touch sensor is closely attached to the touch part, the elastic member generating a base voltage in the touch sensor in a no-touch state.

In further another embodiment, a refrigerator includes: a door of which at least a portion of an outer appearance is defined by a front panel having a plate shape, the door including a window through which light for displaying information is transmitted onto the front panel; a display assembly mounted inside the door, which corresponds to the window; a touch sensor assembly closely attached to a rear surface of the front panel, the touch sensor assembly including a plurality of sensors detecting touch manipulation on the front panel; a sensor control part connected to the sensor assembly to process a manipulation detecting signal of each of the sensors, wherein the sensor control part determines the user's manipulation as erroneous manipulation when the manipulation detecting signals are generated at the same time from the plurality of sensors to ignore the manipulation detecting signals of the sensors.

In further another embodiment, a method for controlling a refrigerator including a sensor for detecting manipulations of a plurality of touch parts formed on a front panel of a refrigerator door and in which an operation input of the refrigerator is enabled by the sensor in a normal mode includes: entering into a specific mode for confirming an operation state of the refrigerator and changing a set of the refrigerator by a second manipulation in which one of the plurality of touch parts is manipulated within a preset time after a first manipulation in which one of the plurality of touch parts is manipulated.

In further another embodiment, a refrigerator may include: a door of which at least a portion of an outer appearance is defined by a front panel having a plate shape and in which a window through which light for displaying information is transmitted is disposed in the front panel; a display assembly mounted inside the door to correspond to the window; a touch sensor assembly closely attached to a rear surface of the front panel, the touch sensor assembly including a plurality of sensors for detecting user's manipulation on the front panel; and a sensor control part connected to the touch sensor assembly to process manipulation detection signals of the sensors, wherein the sensor control part determines the user's manipulation as erroneous manipulation when the manipulation detection signals of the plurality of sensors occur at the same time to ignore the manipulation detection signals of the sensors.

In further another embodiment, a method for controlling a refrigerator including a sensor for detecting manipulations of a plurality of touch parts formed on a front panel of a refrigerator door and in which an operation input of the refrigerator is enabled by the sensor in a normal mode includes: entering into a specific mode for confirming an operation state of the refrigerator and changing a set of the refrigerator by a second manipulation in which one of the plurality of touch parts is manipulated within a preset time after a first manipulation in which one of the plurality of touch parts is manipulated.

In further another embodiment, a method for controlling a refrigerator includes: successively manipulating a plurality of touch parts formed on a front panel of a refrigerator door to enter into a specific mode; selecting one of the plurality of touch parts to select a sensor in which touch sensitivity setting is desired; continuously manipulating the selected touch part to increase or decrease a sensitivity setting value of the selected sensor; and storing the sensitivity setting value of the sensor, in which the sensitivity setting value is increased or decreased, into a storage part and releasing the specific mode to enter into a normal mode.

Advantageous Effects of Invention

According to the embodiments, even through the user pushes the front panel with the small force, since the touch sensor is closely attached to the front panel to directly contact the front panel, the deformation of the front panel may be transmitted to the touch sensor as it is to improve the touch recognition performance.

Also, since the touch sensor is being pressed in the direction thereof by the elastic member, the adhesion force between the front panel and the touch sensor may be improved. In addition, the base voltage generated in the touch sensor may increase by the compressive elastic force of the elastic member to allow the touch manipulation to be enabled with the small force, thereby improve the sensitivity of the touch sensor.

Also, due to the improvement of the touch recognition performance, the reliable touch recognition may be enabled even though the front panel defining the outer appearance of the home appliance has the thick thickness.

Also, the home appliance may enter into the special mode for the service or inspection when the user successively manipulates the specific touch parts in a fixed order to prevent the malfunction due to the user's carelessness from occurring.

Also, according to the embodiment, the plurality of touch parts may be not recognized at the same time to prevent the plurality of touch parts from being selected by the touch mistake due to the characteristics of the touch sensor or to prevent the refrigerator from being malfunctioned or entering into an undesired special mode due to the impact when the door is opened.

Also, the sensitivity occurring when the user touches the touch part may be intuitively set by pushing the corresponding touch part. The change in sensitivity may be displayed through the display to allow the user to more accurately and easily adjust the touch sensitivity.

Also, the touch part may be adjusted to touch sensitivity that is desired by the user to prevent the recognition error in touch manipulation or the damage due to the excessive push from occurring. Since the user sets the optimum sensitivity that is desired by the individual user, the convenience in use of the user may be improved.

Also, each of the plurality of touch parts is set to the desired sensitivity, and diverse sets may be enabled according to the user's preference or user pattern.

BRIEF DESCRIPTION OF DRAWINGS

FIG. 1 is a front view of a refrigerator according to an embodiment.

FIG. 2 is a perspective view of the refrigerator door according to an embodiment.

FIG. 3 is a view illustrating a display window and manipulation part of the refrigerator door.

FIG. 4 is an exploded perspective view illustrating a mounted structure of a display assembly of the refrigerator door.

FIG. 5 is an exploded perspective view of the refrigerator door with a front panel separated.

FIG. 6 is an exploded perspective view illustrating a coupled structure of a touch sensor assembly, a display cover, a display assembly, a display frame, and a frame cover according to an embodiment.

FIG. 7 is a cross-sectional view taken along line 7-7' of FIG. 4.

FIG. 8 is a cross-sectional view taken along line 8-8' of FIG. 4.

FIG. 9 is a block diagram illustrating connection between a sensor PCB and a display PCB.

FIG. 10 is a perspective view illustrating a coupled structure between the display cover and the display frame.

FIG. 11 is an exploded perspective view illustrating a coupled structure between the display cover and the touch sensor assembly.

FIG. 12 is a rear perspective view of the display cover on which the touch sensor assembly is mounted.

FIG. 13 is a cutaway perspective view taken along line 13-13' of FIG. 2.

FIG. 14 is an enlarged cross-sectional view of a portion A of FIG. 13.

FIG. 15 is an exploded front perspective view of a touch sensor assembly according to an embodiment.

FIG. 16 is a rear exploded perspective view of the touch sensor assembly.

FIG. 17 is a longitudinal cross-sectional view of the touch sensor.

FIGS. 18A and 18B are plan and rear views of the sensor PCB that is a main component of the touch sensor assembly.

FIG. 19 is a plan view of a spacer that is a main component of the touch sensor assembly.

FIG. 20 is a plan view of a conductive foil that is a main component of the touch sensor assembly.

FIG. 21 is a rear perspective view of the touch booster that is a main component of the touch sensor assembly.

FIG. 22 is a cutaway perspective view taken along line 22-22' of FIG. 2.

FIG. 23 is an enlarged cross-sectional view of a portion B of FIG. 22.

FIG. 24 is a cross-sectional view illustrating a state in which the touch sensor assembly is mounted.

FIG. 25 is a schematic view illustrating a structure of a main component of a touch sensor assembly according to another embodiment.

FIG. 26 is a schematic view illustrating a structure of a main component of a touch sensor assembly according to further another embodiment.

FIG. 27 is a schematic view illustrating a structure of a main component of a touch sensor assembly according to further another embodiment.

FIG. 28 is a flowchart illustrating a process of performing a sensitivity setting mode of the refrigerator according to an embodiment.

FIG. 29 is a view illustrating a manipulation method when entering into the sensitivity setting mode.

FIG. 30 is a view illustrating one state when the sensitivity is set in the sensitivity setting mode.

FIG. 31 is a view illustrating another state when the sensitivity is set in the sensitivity setting mode.

FIG. 32 is a view illustrating a process of entering into an inspection mode in the refrigerator according to an embodiment.

FIG. 33 is a view illustrating a process of entering into a test mode in the refrigerator according to an embodiment.

FIG. 34 is a view illustrating a process of entering into a store display mode in the refrigerator according to an embodiment.

FIG. 35 is a schematic view illustrating a touch manipulation sensing state in a home appliance including a touch sensor according to a related art.

FIG. 36 is a schematic view illustrating a touch manipulation sensing state in the touch sensor according to an embodiment.

MODE FOR THE INVENTION

FIG. 1 is a front view of a refrigerator according to an embodiment. A refrigerator 1 according to an embodiment includes a cabinet defining a storage space and a refrigerator door 10 mounted on the cabinet to open or close the storage space. An outer appearance of the refrigerator 1 may be defined by the cabinet and the refrigerator door 10.

The storage space may be partitioned into both left/right sides or vertically partitioned. A plurality of refrigerator doors 10 for opening/closing the spaces may be disposed on the opened spaces of the storage space. Each of the refrigerator doors 10 may open and close the storage space in a sliding or rotating manner. When the refrigerator door 10 is closed, the refrigerator door 10 may define a front outer appearance of the refrigerator 1.

A display window or a display area 11 and a manipulation part or user interface may be disposed on one refrigerator door 10 of the plurality of refrigerator doors 10 at a height at which user's manipulation and distinguishment are easy. The display window 11 may be configured to appear an operation state of the refrigerator 1 to the outside. A symbol or figure may be expressed while light is irradiated into the refrigerator door 10 to allow a user to identify the symbol or figure. The display window 11 may be commonly defined as a hole through which light is transmittable or a transparent portion.

The manipulation part may be a portion that is constituted by a plurality of touch parts for performing touching manipulation to operate the refrigerator 1. The touch manipulation part or touch user interface 12 may be disposed on a portion of a front surface of the refrigerator door 10. A portion at which the pushing manipulation is capable of being detected may be defined by surface processing such as printing or etching or various light transmission methods.

As illustrated in FIGS. 2 to 5, the refrigerator door 10 includes a front panel 20 defining a front outer appearance thereof, deco members 40 and 43 that are respectively disposed on upper and lower ends of the front panel 20, and a door liner 30 defining a rear outer appearance thereof. An overall outer appearance of the refrigerator door may be defined by the front panel 20, the deco members 40 and 43, and the door liner 30.

The front panel 20 may define the front outer appearance of the refrigerator door 10 and be formed of a stainless steel material having a plate shape. The front panel 20 may constitute at least a portion of the outer appearance of the refrigerator door 10. The front panel 20 may be applied to an exterior member in other home appliances.

The front panel 20 may be formed of metal or a material having the same texture as the metal. The front panel 20 may be formed of a glass or plastic material. The front panel 20 may define a portion of a side surface of the refrigerator door 10 as well as the front surface of the refrigerator door 10. Fingerprint prevention processing or hairline processing may be further performed on a surface of the front panel 20.

The display window 11 may be defined by a plurality of first through holes or light transmitting material or surface 21 provided in a portion of the front panel 20. The display window 11 may be constituted by a numerical display part or interface 11a for display figures and a set of the plurality of first through holes 21 in which a symbol display parts or interface 11b for displaying symbols, charters, or pictures are punched at a predetermined distance.

As illustrated in the drawings, the numerical display part 11a may be disposed in the form of seven segments that is a set of the plurality of first through holes 21. The numerical display part 11a may be disposed on each of upper and lower portion to independently display temperatures of the refrigerating compartment and the freezing compartment. Alternatively, the numerical display part 11a may display various information that are capable of being displayed by using figures in addition to the temperature information. The numerical display part 11a may selectively display the various information through the manipulation of the manipulation part or the user interface.

The symbol display parts 11b are disposed under the numerical display part 11a. The symbol display parts 11b may display an operation state of the refrigerator 1 by using a symbol or picture. The set of the first through holes 21 may be disposed in a shape corresponding to the symbol display parts 11b to allow the user to intuitively see the operation state of the refrigerator 1.

For example, a symbol, which is disposed at the lowermost position, of the symbol display parts 11b of FIG. 3 may be expressed in a lock shape to indicate a locked state. A symbol that is disposed at an intermediate position may be expressed in a filter shape to indicate a sanitization or deodorization operation. Alternatively, the symbol display part 11b may have various shapes and be provided in various numbers.

The display window 11 may be defined to correspond to second and third through holes 220 and 321 which will be described later so that light emitted from an LED 313 of a display assembly 300 is transmitted therethrough. The first through hole 21 may be formed with a fine size through laser processing or etching. The first through hole 21 may be formed with a size at which it is difficult to easily identify the operation state of the refrigerator when light is not transmitted.

Although the numerical display part 11a and the symbol display part 11b are not clearly illustrated in FIG. 3 so as to allow the numerical display part 11a and the symbol display part 11b to be expressed as the form that is constituted by the plurality of first through holes 21, if the LED 313 is turned off in a state where the first through holes 21 are spaced a predetermined distance from each other, it may be difficult to distinguish the numerical display part 11a and the symbol display part 11b because each of the first through holes has a fine size.

In case of the numerical display part 11a, only a portion onto which light is irradiated according to operations of the seven segments of the light source may be transmitted through the first through holes 21 to display figures on the front panel 20. On the other hand, a portion onto which the light is not irradiated may not be well distinguished. In case of the symbol display part 11b, if the corresponding LED is turned on when the corresponding function is performed, light may be irradiated to allow the symbol display part 11b to be distinguished. On the other hand, if the LED is turned off, the symbol display part 11b may not be well distinguished.

As described above, the fine or minute holes 21 of the numerical display part 11a and the symbol display part 11b for the display window 11 may not be visible when light is turned off. Thus, other components may not be disposed on the front surface of the refrigerator door 10, and the entire front surface of the refrigerator door 10 may be expressed as if a metal plate by using the front panel 20 to realize the simple and elegant outer appearance of the front surface of the refrigerator door 10.

A sealing member 22 may be filled into the first through hole 21. The sealing member 22 may prevent the first through hole 21 from being blocked by foreign substances. The sealing member 22 may be formed of a silicon or epoxy material so that the first through hole 21 is blocked, but the light is transmitted. The inside of the first through hole 21 may be filled with the sealing member 22 to prevent a processed surface of the first through hole 21 from being corroded.

The sealing member 22 may be filled into the first though hole 21 through a separate process. The sealing member 22 may be filled into the first through hole 21 while a coating process is performed on the surface of the front panel 20, or the sealing member 22 may be attached in the form of a sheet to block the plurality of first through holes at the same time. A fingerprint preventing coating and/or a diffusion sheet within the front panel 20 may function as the sealing member 22.

The manipulation part may be a portion that is displayed to allow the user to perform the touch manipulation and be constituted by a plurality of touch parts or input area 12. The touch part 12 may display an area that is detected by the touch sensor assembly 500 when the user touches the area of the touch part. The touch parts 12 may not be physical buttons, but be areas that are displayed on the front surface of the front panel 20. A sensor 750 (see, e.g., FIG. 17) contacting the rear surface of the front panel 20 may be manipulated through the manipulation of the displayed area.

The touch parts 12 may be displayed on the front panel 20 through etching, printing, or other surface processing. Thus, the touch manipulation part 2 may be expressed in a shape that does not stand out when viewed from the outside so that the outer appearance of the front panel 20 is expressed by the whole texture of the front panel 20. The touch parts 12 may be displayed so that the user intuitively understand and manipulate the corresponding function of each of the touch part 12 as the form of the character or symbol. Each of the touch parts 12 may display an area that is recognizable when the user's touch is performed. When the displayed portion of the touch part 12 is pushed, the area may be effectively recognized.

The door liner 30 may have a surface that is coupled to the front panel 20 to face the inside of the storage space. The door liner 30 may be injection-molded using plastic. The door liner 30 may have a structure in which a gasket is disposed or mounted along a circumferential thereof. When the door liner 30 is coupled to the front panel 20, a space may be defined between the door liner 30 and the front panel 20. A foaming solution for forming an insulation material 24 may be filled into the space.

A frame 100 may be attached to a rear surface of the front panel 20. The frame 100 may provide a separate space in which the foaming solution is not filled into the refrigerator door 10 to accommodate the cover display 200, the display assembly 300, the touch sensor assembly 500, and a display frame 400.

The deco members or trims 40 and 43 may define outer appearances of upper and lower portions of the refrigerator door 10. The deco members 40 and 43 may cover the opened upper and lower end of the refrigerator door 10, which are defied by coupling the front panel to the door liner 30, respectively.

An insertion hole 41 and an insertion hole cover 42 for opening/closing the insertion hole 41 may be disposed in/on the upper deco member 40 of the deco members 40 and 43. The insertion hole 41 may pass through the deco member 400 to communicate with the space that is defined by the frame 100. The display assembly 300 may be inserted into the display frame 400, with which the display assembly 300 is assembled, through the insertion hole 41. The insertion hole 41 may have a size in which the display frame 40 is insertable. The insertion hole 41 may be vertically defined with respect to the display cover 200.

Although not shown in detail, a hinge hole to which a rotation shaft of the refrigerator door 10 is hinge-coupled may be defined in one side of the deco member 40. The deco member 40 may have a structure in which a wire guided inside the frame 100 is accessible through the hinge hole and then is connected to a power source part of the cabinet.

A door handle 44 may be disposed on the lower deco member 43 of the refrigerator door 10. The door handle 44 may be recessed in a pocket shape to manipulate the rotation of the refrigerator door 10. A lever 45 for manipulating the opening/closing of the refrigerator door 10 may be further disposed on the lower deco member 43 of the refrigerator door 10. A latch assembly 31 may operate by the manipulation of the lever 45 to selectively maintain the opening or closing of the refrigerator door 10.

The display cover 200 is attached to the rear surface of the front panel 20. The display cover 200 may guide the mounting of the display assembly 300 on which the LED 313 (see FIG. 14) is mounted. The display cover 200 may be attached to the rear surface of the front panel 200 by a double-sided tape or an adhesion member 25 (see FIG. 7) that is formed by applying primer thereon.

The touch sensor assembly 500 for detecting user's pushing manipulation on the front panel 20 may be mounted on one side of the display cover 200. The display cover 200 may have a structure in which the cover display 20 is attached to the front panel 20 in a state where the display cover 200 is coupled to the touch sensor assembly 500.

The display cover 200 may be attached to a position at which the display window 11 and the second through hole 220 defined in the cover display 200 match each other. Also, the display cover 200 may be accommodated into the frame 100 in the state where the display cover 200 is attached.

The display assembly 300 is inserted into the space within the frame 100 through the insertion hole 41 in the state where the display assembly 300 is mounted on the display frame 400. When the display frame 400 is completely inserted, the display assembly 300 may be disposed inside the display cover 200, and light emitted from the LED 313 may pass through the display cover 200 and the display window 11 and then be irradiated to the outside.

As illustrated in FIGS. 6 to 9, the front and top surfaces of the frame 100 may be opened. When the frame 100 is attached to the front panel 20, the top surface of the frame 100 may define an opened space 110. A circumference of the frame 100 except for an upper end of the frame 100 may be bent toward the front panel 20, and then, an end of the frame 100 may be bent to the outside to form a frame adhesion part or flange 120. An adhesion member 25 including a double-sided tape or adhesive may be disposed on the frame adhesion part 120. The frame 100 may be attached to the rear surface of the front panel 20.

The frame 100 may have an upper end that contacts the deco member 40 in the state where the frame 100 is attached to the front panel 20. The opened top surface of the frame 100 may communicate with the insertion hole 41 and provide an independent space within the refrigerator door 10. Even though the foaming solution for forming the insulation material 24 is injected into the refrigerator door 10, the foaming solution may not be introduced into the inner space of the frame 100, and thus the frame 100 may be protected.

A plurality of reinforcing ribs may be disposed on the rear surface of the frame 100 to cross each other in length and width directions. Even though the high-pressure foaming solution is filled to form the insulation material 24, the frame may not be deformed due to the reinforcing ribs 130, and the inner space of the frame 100 may be maintained. A plate support 140 on which a support plate 141 is seated is disposed on each of both left/right ends of the upper portion of the frame 100.

The support plate 141 may be disposed in an upper space of the frame 100, which corresponds to an upper side of the display cover 200, in the state where the display cover 200 is mounted on the support plate 141 to support the front panel 20 from a rear side. Thus, rolling of the portion of the frame corresponding to the front panel 20 may be prevented, and also, the deformation of the front panel 20 by an external impact may be prevented.

The plate support 140 may be stepped to support both ends of the support plate 141. The support plate 141 may be slidably inserted into the space between the plate support 140 and the front panel 20 in the state where the frame 100 is attached to the front panel 20. After insertion, a lower edge of the support plate 141 is above a restriction groove 160. In other words, the support plate is provided at the upper region of the frame 100. Alternatively, the support plate 141 may be attached to the rear surface of the front panel 20 when both ends of the plate support 140 are attached to the frame 100 in the fixed state.

A wire entrance hole 150 may be defined in an upper portion of a side surface of the frame 100. The wire entrance hole 150 may provide a passage through which the wire for connecting electronic components to the power source of the cabinet is accessible. The wire entrance hole 150 may be defined in an upper portion of the side surface of the frame 100 that is adjacent to the hinge of the refrigerator door 10 and be defined in a position that is adjacent to a hinge hole of the refrigerator door 10. The frame 100 may be finished to prevent the foaming solution from being introduced into the frame 100 when the foaming solution is injected into the refrigerator door 10.

A restriction groove 160 may be defined in each of both left/right sides of the frame 100. A restriction part or protrusion 230 protruding laterally from each of both left/right ends of the cover display 200 may be inserted into the restriction groove 160. The restriction groove 160 may be receded to the outside and have a shape corresponding to that of the restriction part 230. Thus, the cover display 200 may be maintained in an accurate position without moving.

A cover support 170 for supporting the display cover or plate 200 is disposed on a portion of the frame 100 below the restriction groove to correspond to the display cover 200. The cover support 170 may protrude from each of both left/right surfaces of the frame 100 to push both left/right ends of the display cover 200 from a rear side, thereby supporting the cover display 200.

When the frame 100 is attached to the front panel 20, and the foaming solution is injected into the refrigerator door 10 in the state where the display cover 200 is attached to the rear surface of the front panel 20, the cover support 170 may push the display cover 200 forward to maintain the state in which the display cover 200 is attached to the front panel 20. Even though the adhesion member 25 for attaching the cover display 200 to the front panel 20 is cured to lose its function, the cover support 170 may press the cover display 200 to maintain the state in which the front panel 20 and the cover display 200 are closely attached to each other.

The cover support 170 may be provided in plurality. The plurality of cover supports 170 may be vertically disposed at a uniform distance to uniformly push and support the entire display cover 200. A protrusion 171 protruding forward may be further disposed on a front surface of the cover support 170 that is adjacent to the display cover 200. The protrusion 171 may have a rib or projection shape that is lengthily disposed in a transverse direction to line or point contact the display cover 200. Even though a contact surface between the display cover 200 and the cover support 170 is uneven, the display cover 200 may not be inclined so that the cover support 170 applies a uniform pressure to the display cover 200.

The display cover 200 may be formed of a plastic material having a plate shape. The display cover 200 may be accommodated into the frame 100 in the state where the display cover 200 is attached to the front panel 20. The restriction part 230 protruding outward and inserted into the restriction groove 160 may be disposed on an upper portion of each of both left/right ends of the cover display 200.

An accommodation part or opening 210 on which the touch sensor assembly 500 is mounted may be disposed on the cover display 200. A plurality of second through holes 220 may be defined in a position corresponding to the display window 11 in the cover display 200.

The display assembly 300 may include a display PCB 310 on which the LED 313 is mounted and a reflector 320 disposed on a front surface of the display PCB 310. A sensor control part or sensor controller 314 for processing a signal transmitted from the sensor 750, a storage part or storage medium 315 for storing a sensitivity setting value of the sensor 750, and a host control part or controller 316 for controlling an operation of the display assembly 300 and providing the sensitivity setting value stored in the storage part 315 may be disposed on the display PCB 310.

Since the sensor control part 314 is disposed on the display assembly 300 that is spaced apart from the touch sensor assembly 500, the sensor control part 314 is connected to the sensor PCB 700 of the touch sensor assembly 500 through a cable connector 600. A signal of the sensor 750, which is detected by the touching manipulation at a position that is spaced apart from the touch sensor assembly 500 manipulated by the user, may be processed in the sensor control part 314.

The sensor control part 314 may receive a variation value in quantity of electricity that is generated in the sensor 750 (see also, e.g., FIG. 25, which is described hereinafter) to process the variation value in quantity of electricity as data, thereby transmitting the data into the host control part 316. The sensor control part 314 may also compare the variation value in quantity of electricity, which is inputted when the sensor 750 is manipulated, to the sensitivity setting value stored in the storage part 315 to determine whether the manipulation of the sensor 750 is effective. The sensor control part 314 may transmit the determined result into the host control part 316, and the user may recognize the manipulation according to the pushed degree when the touch part 12 of the front panel 20 is manipulated.

The host control part 316 may receive the result with respect to whether the sensor 750 is manipulated from the sensor control part 314 to display the result corresponding to the manipulation of the selected sensor or sensor array 750 on the display window 11 or transmit a signal for instructing an operation of the refrigerator 1 into a main control part that is separately provided or directly transmit the signal into electronic components for driving the refrigerator 1. The host control part 316 may be connected to the storage part 315, in which the sensitivity setting value of the sensor 750 is stored, to transmit and receive data with respect to the sensitivity setting value.

The storage part 315 may store the sensitivity setting value that is compared to the variation value in quantity of electricity that is generated when the sensor 750 is manipulated. An EEPROM or a non-volatile memory may be used as the storage part 315. The sensitivity setting value of the sensor 750 may be continuously stored in the storage part 315. Even though the refrigerator 1 is turned off and then turned on, the sensitivity setting value of the sensor 750 may be stored and maintained.

When the touch part or interface 12 is pushed, the sensor control part 314 may determine whether the pushing manipulation or touch input of the touch part 12 is effective to transmit the determined result to the host control part 316. When a special mode such as the sensitivity setting is activated, the sensitivity setting value stored in the storage part 315 may be adjusted to allow the user to recognize the manipulation of the touch part 12 at the desired sensitivity.

A flow of the signal according to the manipulation of the touch part 12 will be described in more detail with reference to FIG. 9. When the user pushes one touch part 12 of the touch parts under a general manipulation situation, a pressure generated when the front panel 20 is deformed may be detected by the sensor 750. The sensor 750 may generate a quantity of electricity which varies based on the pressure of the touch input. The variation value in quantity of electricity may be transmitted into the sensor control part 314.

The inputted variation value in quantity of electricity and the sensitivity setting value stored in the storage part 315 may be compared to each other. If the inputted variation value in quantity of electricity satisfies the stored sensitivity setting value, the manipulation of the sensor 750 is successively recognized by the host control part 316. The host control part 316 may instruct an operation of the refrigerator by the touch part 12 selected according to the data transmitted from the sensor control part 314 to display the operation of the refrigerator on the display window 11.

In a state where the user successively pushes a specific touch part of the plurality of touch parts 12 to enter into the sensitivity setting mode, an input signal may be transmitted into the sensor control part 314, and data processed in the sensor control part 314 may be transmitted into the host control part 316. A new sensitivity setting value may be inputted into the storage part 315 according to the inputted data by the host control part 316.

The above-described manipulation may be continuously performed whenever a specific touch part 12 to be manipulated is pushed, and data may be transmitted into the host control part 316 via the sensor control part 314. Whenever the data is transmitted, the host control part 316 transmits a new sensitivity setting value into the storage part 315. Due to the above-described repeated processes, the user may adjust a sensitivity setting value for recognizing the manipulation of the touch part 12.

The sensor control part 314, the host control part 316, and the storage part 315 may be provided as one module on the display assembly 300. All of the sensor control part 314, the host control part 316, and the storage part 315 may be provided on one display PCB 310. If necessary, the sensor control part 314, the host control part 316, and the storage part 315 may be integrated with the display assembly 300 and provided on a plurality of PCBs and then connected to each other.

The sensor PCB 700 on which the sensor 750 is mounted may be separately provided with respect to the display PCB 310, and the sensor PCB 700 and the display PCB 310 may be disposed to be spaced apart from each other. The sensor PCB 700 and the display PCB 310 may be connected to each other by the cable connector 600.

The cable connector 600 includes a first cable connector 610 connected to the sensor PCB 700 of the touch sensor assembly 500 and a second cable connector 620 connected to the display PCB 310. The first and second cable connectors 610 and 620 may be connected to each other, when the display assembly 300 is mounted on the refrigerator door 10.

The cable connector 600 may have a total length greater than a distance from the touch sensor assembly 500 to the insertion hole 41. In the state where the touch sensor assembly 500 is mounted on the display cover 200, the cable connector 600 and the touch sensor assembly 500 may be connected to each other at an outside of the insertion hole 41, and then the display assembly 300 is inserted in the display cover 200.

A display terminal 311 connected to the second cable connector 620 is disposed on a left side of an upper end of the display PCB 310 (when viewed in FIG. 5). This location minimizes an effect due to the static electricity which may be generated when the display terminal 311 is disposed at a position close to the touch sensor assembly 500.

The reflector 320 for guiding light so that the light emitted from the LED 313 travels to the first through hole 21 is disposed on the front surface of the display PCB 310. The reflector 320 may guide the light emitted from the LED 313 and also provides a space between the display PCB 310 and the display terminal 311 and the front panel 20 by a thickness of the reflector 320 to protect the display PCB 310 against the static electricity. Since the front panel 20 may be formed of a stainless steel material, and the display assembly 300 is disposed adjacent to the display window 11, the display PCB 310 may be vulnerable to the generated static electricity due to the above-described structure. However, since the reflector 320 spaces the display PCB 310 from the front panel 20, the display PCB 310 may be protected against the static electricity.

A third through hole 321 communicating with the second through hole 220 and the first through hole 21 may be defined in reflector 320 to correspond to the LED 313. When the display assembly 300 and the display frame 400 are mounted on the cover display 200, the first, second, and third through holes 21, 220, and 321 may be closely mounted or aligned to each other to communicate with each other. Thus, the light emitted from the LED 313 may be irradiated to the outside through the display window 11.

An acoustic output device or an actuator 340 may be disposed on the rear surface of the display PCB 310. The acoustic output device 340 may express an operation state of the refrigerator 1 by sound. For example, a speaker or buzzer may be used as the acoustic output device 340. The acoustic output device 340 may be disposed at a position corresponding to a frame hole 412 of the display frame 400. Thus, sound outputted from the acoustic output device 340 may be transmitted to the user outside the refrigerator door 10 to notify the operation state of the refrigerator 1.

The display PCB 310 is seated on the display frame 400. The display frame 400 may have a plate shape to allow the display PCB 310 to be seated thereon. An edge or flange 410 formed by bending along a circumference of the display frame 400 may be provided to form a space into which the display PCB 310 is accommodated. A sliding insertion part or rail 415 that is bent in both left/right directions is disposed on each of both left/right ends of the frame display 400. The sliding insertion part 415 may be inserted into a rail guide 240 disposed on the cover display 200. The display frame 400 may be mounted on the cover display 200 by the sliding insertion part 415.

Reinforcing ribs 411 disposed in length and width directions to form a lattice shape may be further disposed on an entire front surface of the display frame 400. The frame hole 412 may be defined in one side corresponding to the acoustic output device 340. A frame cutting part or frame cut-out 414 may be disposed on an upper end of the display frame 400. The frame cutting part 414 may be cut to a size corresponding to the display terminal 311 to prevent the display terminal 311 from interfering with the display frame 400. A boss 413 to which a screw 312 is coupled to fix the display PCB 310 is disposed on the display frame 400. The boss 413 may be coupled to the screw 312 and also support the display PCB 310 from a lower side.

A frame handle 420 extending upward is disposed on a central portion of the upper end of the frame display 400. The frame handle 420 may have a predetermined length so that the user holds and manipulates the frame display 400 when the frame display 400 is coupled to the display cover 200.

The frame handle 420 includes a first vertical part or first vertical extension extending from the frame display 400, an inclined part or extension 422 inclinedly extending backward from an upper end of the first vertical part 421, and a second vertical part or extension 423 extending upward from an upper end of the inclined part 422. The first and second vertical parts 421 and 423 may extend in parallel to each other and be connected to each other by the inclined part 422. A grip or grip part 424 to be grasped by the user may extend from an upper end of the second vertical part 423 in a transverse direction.

The user may grasp the grip part 424 to insert a lower end of the display frame 400 into the insertion hole 41 when the display frame 400 is inserted. The more the display frame 400 is inserted downward, the more the display frame 400 is closely attached to the rear surface of the display frame 200 due to the structure of the frame handle 420.

When the insertion hole cover 42 is closed in the state where the display frame 400 is completely inserted, the insertion hole cover 42 may contact the grip part 424. Although not shown, a handle coupling part or mold that is molded in a shape corresponding to that of the grip part 424 is disposed on a bottom surface of the insertion hole cover 42. When the insertion hole cover 42 is closed, an upper end of the frame handle 420 is coupled to the handle coupling part and thus maintained in the fixed state.

As illustrated in FIGS. 10 to 12, the rail guide 240 is disposed on each of both left/right ends of the display cover 200. The rail guide 240 may be configured so that both ends of the display cover 200 are bent to allow the sliding insertion part or rail 415 to be inserted into the rail guide 240.

The rail guide 240 may have a wide upper end so that the sliding insertion part 415 is easily inserted. The rail guide 240 may have an inclined inner surface. The more the display frame is inserted, the more the display assembly 300 mounted on the display frame 400 is closely attached to the display cover 200.

When the display frame 400 is completely inserted, the sliding insertion part 415 may be fixed to the inside of the rail guide 240, and the reflector 320 may be completely closely attached to the rear surface of the display cover 200. The third through hole 321 may be defined to match the second through hole 220.

The display cover 200 has a flat front surface so that the display cover 200 is attached to the rear surface of the front panel 20. The accommodation part 210 into which the touch sensor assembly 500 is accommodated is defined at one side of the front surface of the display cover 200. The accommodation part 210 may be opened in a shape corresponding to that of the touch sensor assembly 500 so that the touch sensor assembly 500 is inserted. In the state where the touch sensor assembly 500 is mounted on the accommodation part 210, the front surface of the touch sensor assembly 500 may be disposed on the same plane as that of the display cover 200.

The accommodation part 210 may also extend backward along an opened circumference of the accommodation part 210. When the touch sensor assembly 500 is mounted, the sides 211a of accommodation part 210 may contact a circumferential surface of the touch sensor assembly 500 to allow the touch sensor assembly 500 to be maintained in the stably mounted state.

A housing support 211b may be disposed on each of four corners within the accommodation part 210. The housing support 211b may further extend from the accommodation part 210 to surround and/or support corners of a sensor housing defining an outer appearance of the touch sensor assembly 500. An end 211c of the housing support 211b may be bent inward to surround and support the circumferential surface and rear surface of the sensor housing. Even though the user pushes the front panel 20 to apply a pressure to the front panel 20, the touch sensor assembly 500 may not move backward, but be maintained in the assembled state.

A housing coupling part or tab 511 that is hooked with the inside of the accommodation part 210 is disposed on each of upper and lower ends of the sensor housing. The housing coupling part 511 may have a shape similar to a hook to allow the touch sensor assembly 500 to be maintained in the state in which the touch sensor assembly 500 is fixed to the inside of the accommodation part 210. The touch sensor assembly 500 is inserted into the accommodation part 210 from a front side, and the housing coupling part 511 is hooked and restricted to one side of the accommodation part 210. Thus, the touch sensor assembly 500 may be coupled to the cover display 200.

The second through hole 220 may be further defined in the front surface of the display cover 200. The second through hole 220 may be defined in a position corresponding to the first through hole 21 when the cover display 200 is attached to the rear surface of the front panel. The second through hole 220 may be opened in a shape corresponding to the seven segments. Holes having various other shapes for expressing other information may be defined. A blocking part or molding 221 is disposed around the second through hole 220. The blocking part 221 may be disposed outside the second through hole 220 to surround the second through hole 220. The blocking part 221 may protrude forward.

The adhesion member 25 that is provided for the adhesion of the cover display 200 may be attached to only an outer area of the blocking part 221. A gap between the first through hole 21 and the second through hole 220, which occurs by a thickness of the adhesion member 25 when the display cover 200 is attached, may be minimized to prevent a light leak phenomenon through the gap from occurring. The blocking part 221 may protrude to a height at which the light leakage is prevented. The blocking part 221 may protrude to a height that is less than or equal to that of the adhesion member 25 before the adhesion member 25 is pressed in consideration of the pressing of the adhesion member 25 that is attached to the front surface of the cover display 200.

Referring to FIGS. 13 and 14, in the state where the cover display 200 is attached to the rear surface of the front panel 20 by using the adhesion member 25, the first and second through holes 21 and 220 may communicate with each other. The first through hole 21 has a substantially smaller size than that of the second through hole 220. The plurality of first through holes 21 may cover one second through hole 220.

When the display frame 400 is completely inserted so that the display assembly 300 is disposed inside the display cover 200, the third and second through holes 321 and 220 may be aligned to each other. The second and third through holes 220 and 321 may have the same size. When the reflector 320 is attached to the rear surface of the display cover 200, the second and third through holes 220 and 321 may completely overlap each other.

The third, second, and first through holes 321, 220, and 21 may communicate or align with each other. As a result, light emitted from the LED 313 may be irradiated to the outside of the refrigerator door 10 via the third, second, and first through holes 321, 220, and 21. A diffusion sheet may be attached to the rear surface of the front panel 20 in which the first through hole 21 is provided. The diffusion sheet 26 may diffuse light emitted from the LED 313 so that the light irradiated through the display window 11 is uniformly irradiated onto the display window 11. Alternatively, the diffusion sheet 26 may be attached to the front panel 20 corresponding to the display window 11 to cover the whole of the first through hole 21.

As illustrated in a front perspective of FIG. 15 and a rear perspective of FIG. 16, the touch sensor assembly 500 may include the sensor housing defining an entire outer appearance thereof, the sensor PCB 700 accommodated into the sensor housing, an elastic member 720 supporting the sensor PCB 700, and a touch booster 530 coupled to an opened front surface of the sensor housing. The sensor housing includes a housing cover 510 and a housing body 520. The housing body 520 is coupled to the housing cover 510 to define an outer appearance of a rear portion of the touch sensor assembly 500 and a space in which the sensor PCB 700 is mounted.

The housing cover 510 defines a front portion of the sensor housing. A housing coupling part or tab 511 for mounting the touch sensor assembly 500 on the cover display 200 is disposed on each of upper and lower ends of the housing cover 510. The housing cover 510 may have an exposed front surface in the state where the touch sensor assembly 500 is mounted in the accommodation part 210. The housing cover 510 may be attached to the rear surface of the front panel by using the adhesion member 25.

An opening 512 is defined in the front surface of the housing cover 510, and the touch booster or a touch transfer plate 530 is mounted on the opening 512. The touch booster 530 may transfer displacement of the front panel 20, which occurs when the user pushes the front panel 20, to a sensor 750 that will be described below. A detailed structure of the touch booster 530 will be described below in detail.

The opening 512 may has a size corresponding to that of the touch booster 530. When the touch booster 530 is mounted to the housing cover 512, the opening 512 may be covered by the touch booster 530. An extension rib 517 extending backward is disposed around the opening 512. The extension rib 517 may contact a circumference of the sensor PCB 700 to allow the sensor PCB 700 to move without being inclined when the sensor PCB 700 moves in a front/rear direction.

A booster support or plate 513 protruding inward and extending backward may be further disposed inside the opening 512. The booster support 513 may support a circumferential portion of the touch booster 530 from a rear side in the state where the touch booster 530 is mounted. Even though a pressure is applied to the touch booster 530, self-movement of the touch booster 530 to a rear side of the preset position may be prevented.

The booster support 513 is disposed along the opening 512, and a hook groove 514 is defined in the booster support 513. The hook groove 514 may be defined in a position corresponding to the hook 531 of the touch booster 530. The hook groove 514 may be formed by cutting a portion of the booster support 513. Alternatively, the hook groove 514 may be separately defined in one side of the housing cover 510 that is adjacent to the opening 512 except for the booster support 513.

The hook 531 and the hook groove 514 may be disposed on/in both left/right positions that face each other. The hook 531 and the hook groove 514 may be vertically disposed at a predetermined distance to prevent the touch booster 530 from being biased in one direction when the touch booster 530 is manipulated.

The hook groove 514 may extend in a front/rear direction. The hook 531 may be movable in the front/rear direction in a state where the hook 531 is disposed inside the hook groove 514. The touch booster 530 may be maintained in the state in which the touch booster 530 is coupled to the housing cover 510 and also move by a predetermined distance in the front/rear direction. Furthermore, the front surface of the touch booster 530 may further protrude than the housing cover 510 in the state where the touch booster 530 is assembled with the housing cover 510. Thus, when the touch sensor assembly 500 and the cover display 200 are attached to the front panel 20, the touch booster 530 may be always maintained in the state in which the touch booster 530 is closely attached to the rear surface of the front panel 20.

A cover coupling part or recesses 516 are disposed on a circumferential surface of the housing cover 510. The cover coupling part 516 may be a portion that matches the body coupling part 521 disposed on the housing body 520. A groove or hole with which the hook-shaped cover coupling part or tab 561 is hooked may be defined in the body coupling part or tab 521. The cover coupling part 516 may be disposed on a position at which the elastic member 720 is capable of being pressed when the cover coupling part 516 and the body coupling part 521 are coupled to each other.

When the housing cover 510 and the housing body 520 are coupled to each other, the elastic member 720 may be pressed to push the sensor PCB 700 and the touch booster 530 toward the front. The touch booster 530 may be maintained in a protruding state in which the touch booster 530 is closely attached to the front panel 20. Thus, when the user pushes the front panel 20, the touch booster may effectively detect the pushing of the front panel 20.

A wire hole 515 is defined in top surface of the housing cover 510. The wire hole 515 is opened so that the first cable connector 610 connected to the sensor terminal 711 on the sensor PCB 700 is accessible. The wire hole 515 may be defined in at least one side, e.g., 515 and 512 of the housing cover 510 and the housing body 520. A wire hole 522 may be defined in a circumferential top surface of the housing body 520. The wire hole 522 may be defined in the same position as the wire hole 515 of the housing cover 510 so that the first cable connector 610 is accessible.

A plurality of body coupling part or tabs 521 are disposed on a circumferential surface of the housing body 520, which is bent forward. The body coupling part 521 may be formed by cutting a portion of the circumferential surface of the housing body 520. The body coupling part 521 may be inserted into the cover coupling part 516 to maintain the state in which the housing cover 510 is coupled to the housing body 520.

The cover coupling part 516 and the body coupling part 521 may be disposed to be spaced a predetermined from each other and face each other at the same position of both left/right sides. The housing cover 510 and the housing body 520 may be coupled to each other with the same force at the same time to prevent the elastic member 720 from being inclined when assembled.

A mounting guide 523 is disposed on a bottom surface of the housing body 520. The mounting guide 523 guides mounting of a plurality of elastic members 720 so that the elastic member 720 attached to the sensor PCB 700 is accommodated. The mounting guide 523 may have a shape corresponding to that of the sensor PCB 700 to provide a space corresponding to a width of the elastic member 720. The elastic member 720 may be disposed inside the mounting guide 523, and both left/right surfaces of the mounting guide 523 may support both left/right ends of the elastic member 720. The mounting guide 523 may stably support the elastic member 720 to prevent the elastic member 720 from being twisted or inclined in one direction when the elastic member 720 is pressed.

A terminal hole 524 is opened from the bottom surface of the housing body 520 corresponding to the sensor terminal 711 disposed on the sensor PCB 700. The terminal hole 524 may have a shape corresponding to that of the sensor terminal 711. The sensor terminal 711 may be exposed through the terminal hole 524. Even though the sensor PCB 700 moves in the front/rear direction, the sensor terminal 711 may not interfere with the bottom of the housing body 520. Since the first cable connector 610 is coupled to a side surface of the sensor terminal 711, the coupled state between the first cable connector 610 and the sensor terminal 711 may be seen through the terminal hole 524.

The sensor PCB 700 is supported by the elastic member 720 inside the sensor housing in a state where a spacer 730, a sensor 750, and a conductive foil 740 (illustrated in FIG. 17) are disposed. Also, the touch booster 530 is mounted in the opening 512 so as to be movable in the front/rear direction. The displacement occurring when the front panel 20 and the conductive foil 740 contact each other and are pushed may be immediately transmitted into the sensor 750.

As illustrated in FIGS. 17 to 20, the sensor PCB 700 is formed of a plastic material, and a copper film 712 constituting a circuit is printed on a surface of the sensor PCB 700. The sensor 750 for detecting push displacement of the front panel 20, which occurs by the user's touch, is disposed on the front surface of the sensor PCB 700.

A piezo-sensor may be used as the sensor 750. A ceramic device or sheet 752 may be attached to a top surface of a metal plate 751. The metal plate 751 may be elastically deformable according to a pressure of the touch manipulation of the front panel 20. A variation in quantity of electricity occurs due to the pressure on the ceramic device 752. Although the sensor 750 has a circular shape in the current embodiment, the sensor 750 may have a different shape. The sensor 750 may be provided in plurality along the sensor PCB 700. A sensor support 713 is disposed on the front surface of the sensor PCB 700 on which the sensor 750 is mounted.

The sensor support 713 may be defined by a groove having a diameter that is less than a size of the sensor. The sensor support 713 may not support a circumference of the sensor 750, but support a circumference of the metal plate 751. The sensor support 713 may support the lower circumference of the metal plate 751. The sensor support 713 may have a projection or disc shape for supporting the circumference of the metal plate 751, but may not have a groove shape. The sensor support 713 may have a size that is less than a diameter of the metal plate 751, but greater than a diameter of the ceramic device 752. The metal plate 751 may be deformed by a pressure that is applied from a front side, and thus, the ceramic device 752 may effectively detect a variation in pressure.

A common contact point 714 connected to the plurality of sensors through the circuit is disposed on one side of the sensor PCB 700. The common contact point 714 connects bottom surfaces of the plurality of sensors 750 to each other. When the conductive foil 740 adheres, the common contact point 714 may contact a conductive line 741 of the conductive foil 740 and be connected to a negative electrode of each of the plurality of sensors 750 to electrically connect the sensor.

A mounting display part or mounting alignment aid 715 for displaying an accurately mounted position of the elastic member 720 is disposed on the rear surface of the sensor PCB 700. The mounting display part 715 may be formed through printing or processing. The mounting display part 715 may be used to alignment position or placement of the elastic member 720.

The mounting position of the elastic member 720, e.g., the position of the mounting display part 715, may be disposed on both left/right sides (when viewed in FIG. 17) with respect to the sensor 750. The mounting position of the elastic member 720, e.g., the position of the mounting display part 715, may be disposed outside an outer end of the sensor 750. The elastic member 720 may be disposed to prevent the elastic member 720 from interfering with the sensor 750, and to prevent the detectability of the sensor 750 from being deteriorated. Furthermore, the plurality of elastic members 720 may be disposed to be spaced a predetermined distance from the sensor 750 to apply substantially the same pressure to the sensor PCB 700.

The plurality of sensors 750 may be disposed in the same extension line as or in a alignment with the body coupling part 521 and the cover coupling part 516. As illustrated in FIGS. 14 and 15, the body coupling part 521 and the cover coupling part 516 may be disposed on the same extension line as both left/right sides of the sensor 750. The body coupling part 521 and the cover coupling part 516 may be disposed between the pair of elastic members 720 that are adjacent to the sensor 750. The body coupling part 521 and the cover coupling part 516 may be disposed on both left/right sides of one sensor 750, and the pair of elastic members 720 may be disposed in a direction of the body coupling part 521 and the cover coupling part 516. Thus, a pressure may be uniformly applied to the whole sensor PCB 700 disposed in the sensor housing, and the plurality of sensors 750 may detect the user's manipulation signal under the same or substantially similar condition.

The spacer 730 is attached to the front surface of the sensor PCB 700. The spacer 730 may be configured to bond the sensor PCB 700 to the conductive foil 740. An adhesion member such as a double-sided tape may be used as the spacer 730. The spacer 730 may have a size corresponding to that of each of the sensor PCB 700 and the conductive foil 740. The spacer 730 also may have a predetermined thickness so that the conductive foil 740 contacts a top surface of the sensor 750 and the common contact point 714 at an adequate height thereof.

A sensor hole 731 is punched or provided at a position corresponding to that of the sensor 750. The sensor hole 731 may have a size greater than that of the sensor 750 to accommodate the sensor 750 therein. When the sensor 750 operates, there is no interference between the sensor 750 and the sensor hole 731. The sensor hole 731 may be provided in number corresponding to the number of sensors 750. A vent hole 732, which is cut by a predetermined length, is defined in each of the sensor holes 731.

Bubbles generated when the spacer 730 is attached to the front surface of the sensor PCB 700 may be discharged through the vent hole 732. The vent hole 732 may be defined and extended along a longitudinal direction of the spacer 730 from an edge of the sensor hole 731. All of the vent holes 732 are extended in one direction. Thus, the spacer 730 may be attached to the front surface of the sensor PCB 730 in a direction in which the vent hole 732 extends from the edge of the sensor hole 731 in order to discharge the bubbles through the vent hole 732.

When the spacer 730 and the conductive foil 740 are attached, guide parts may be provided on the spacer 730 and the conductive foil 740 so that the spacer 730 and the conductive foil 740 are aligned accurately.

The guide parts may be through holes or alignment holes 733 and 744 that are defined in the spacer 730 and the conductive foil 740. The through holes 733 and 744 may be provided in plurality along the spacer 730 and the conductive foil 740 to align with each other. The through holes 733 may be alternately disposed in such a manner that one of the through holes 733 is disposed near one edge of the spacer 730 and the other of the through holes 733 is disposed near the other edge of the spacer 730. The other edge is opposite to the one edge, and the one of the through holes 733 is apart from the other of the through holes 733 in the longitudinal direction of the spacer 730. The through holes 744 are disposed in the conductive foil 740 in the same manner as the through holes 733. An alignment rod may be vertically disposed on the sensor PCB 700 at a position corresponding to each of the through holes 733 and 744. Thus, the alignment rod may pass through each of the through holes 733 and 744 to successively attach the spacer 730 and the conductive foil 740 on to the sensor PCB 700. The spacer 730 and the conductive foil 740 may be attached to accurate positions by a coupling of the through holes 733 and 744 using the alignment rod. The through holes 733 and 744 of the spacer 730 and the conductive foil 740 may be spaced a predetermined distance from the sensor 750 disposed on the sensor PCB 700 to prevent errors of the plurality of sensors 750 from occurring. After attaching of the spacer 730 and the conductive foil 740 on to the sensor PCB 700, the alignment rod may be removed from the sensor PCB 700.

The conductive foil 740 may be formed of a resin film material such as PET. The conductive foil 740 may have a size corresponding to that of each of the sensor PCB 700 and the spacer 730. A conductive line 741, which connects the plurality of sensors 750 to the common contact point 714, may be disposed on the conductive foil 740. The conductive line 741 may be printed on a bottom surface of the conductive foil 740 by using a silver material. The surface on which the conductive line 741 may adhere to the spacer 730, and also, contact the sensor 750 and the common contact point 714.

An inner guide line 742 and an outer guide line 743 may be printed on the conductive foil 740 so that the sensors 750 are accurately aligned in position. The inner guide line 742 may have a size corresponding to that of the ceramic device 752, and the outer guide line 743 may have a size corresponding to that of the metal plate 751. When the sensors 750 are mounted accurately, the ceramic device 752 may be disposed in the inner guide line 742, and the metal plate 751 may be disposed in the outer guide line 743. The inner region of the conductive foil 740 defined by the inner guide line 742 includes meshed or lattice metallic pattern, and the conductive line 741 connects the inner regions. The conductive line 741 may connect the common contact point 714 to the top surface (via inner region) of the sensor 750, i.e., the negative electrode to allow the sensor 750 to be electrically connected.

As illustrated in FIG. 21, the touch booster 530 has a size corresponding to that of the opening 512 of the housing cover 510 to cover the opening 512. A hook 531 is disposed on each of both left/right ends of the housing cover 510. The hook 531 may be coupled to the hook groove 514 defined in the housing cover 510 and provided in plurality with a predetermined distance. The hook 531 may moves in the front/rear direction within the hook groove 514.

A plurality of elastically deformable parts or elastic spring having the number corresponding to that of sensors 750 are disposed on the touch booster 530. The elastically deformable parts may be disposed at positions corresponding to those of the touch part 12 of the front panel 20 and the sensor 750. Each of the elastically deformable parts may have an elastically deformable structure in which the elastic deformable part is movable in the front/rear direction. When the user pushes the touch part 12, the front panel 20 may be deformed, and thus, a portion corresponding to an area of the touch part 12 may move in a rear direction to press the sensor 750. When the user's hand is separated from the touch part 12, the elastically deformable part may return to its original position.

The elastically deformable part may include a first extension part 532 extending from one side of the opened region of the touch booster 530, a second extension part 533 extending from a position opposite to the first extension part 532, and a common part 534 disposed at a central portion to connect the first extension part 532 to the second extension part 533.

Each of the first and second extension parts 532 and 533 may have a relatively narrow width so that the common part or central region 534 is movable. Each of the first and second extension parts 532 and 533 may extend to a sufficient length and be bent at least once. Thus, the first and second extension parts 532 and 533 may be easily elastically deformable. Each of the first and second extension parts 532 and 533 may extend and be curved along a circumference of the common part 534. The first and second extension parts 532 and 533 may be symmetrical to each other with respect to the common part 534. An area except for the first and second extension parts 532 and 533 and the common part 534 may be spirally cut in a central direction of the common part 534 to form a cut part or a cut-out 536. The area may be cut along circumferences of the first and second extension parts 532 and 533 and the common part 534.

A protrusion 535 protruding downward is disposed on a bottom surface of the common part 534. The protrusion 535 may be disposed at a center of the common part 534 to correspond to a center of the sensor 750. Thus, when the common part 534 moves backward, the common part 534 may press the center of the sensor 750.

As illustrated in FIGS. 22 to 24, the touch sensor assembly 500 is attached to the front panel 20 in a state where the touch sensor assembly 500 is mounted on the display cover 200. The adhesion member 25 may be attached to the front surface of the display cover 200 and the front surface of the housing cover 510 so that the display cover 200 and the touch sensor assembly 500 adhere to the rear surface of the front panel 20.

The adhesion member 25 may not be provided on the touch booster 530, and the touch booster 530 may be closely fitted to the rear surface of the front panel 20. When the touch sensor assembly 500 is assembled, the elastic member 720 may push the sensor PCB 700 forward while being pressed. Thus, the sensor PCB 700 may be closely fitted to the touch booster 530. The touch booster 530 may be movable in the front/rear direction in the state where the touch booster 530 is coupled to the housing cover 510. The touch booster 530 may further protrude forward from the front surface of the housing cover 510 by the restorative force of the elastic member 720.

Although the display cover 200 and the housing cover 510 adhere to the front panel 20 by the adhesion member 25, the front surface of the touch booster 530 may be in substantially continuous contact to the rear surface of the front panel 20. In this state, when the user touches the touch part 12 of the front panel 20, displacement may occur on an area of the manipulated or touched front panel 20. The displacement of the front panel 20 may be immediately transmitted into the sensor 750 through the touch booster 530 to press the sensor 750. The sensor 750 may detect the user's manipulation or touch pressure. The elastic member 720 may be further pressed according a pressure during the manipulation thereof. The touch booster 530 may move backward by the coupling between the hook 531 and the hook groove 514.

When the user's hand is separated from the touch part 12, the sensor PCB 700 and the touch booster 530 may move again forward by a restoring force of the elastic member 720, a restoring force of the touch booster 530, and a restoring force of the metal plate 751 of the sensor 750 to return to its original state. In a refrigerator 1 according to an embodiment, when the user manipulates the touch part 12, the front panel 20 may be deformed. A variation in quantity of electricity may occur due to the pressure by the deformation of the front panel 20. The variation value may be transmitted into the sensor control part 314 to detect user's touch manipulation. When an area of the touch part 12 displayed on the front panel 20 is pushed, the user's manipulation may be accurately recognized or detected.

On the other hand, when an area except for the area of the touch part 12 is pushed by the user, it may be difficult to recognize an accurate operation through the sensor 750. In this state, the sensor 750 may not recognize the pushing manipulation. Further, when an area between the plurality of touch parts 12 is pushed, a situation in which two sensors recognize the pushing manipulation at the same time due to structural characteristics of the front panel 20 having one plate shape may occur. In this case, it may not be possible to clearly instruct or recognize a desired operation of the refrigerator 1.

Further, when the door 10 is closed, an impact may occur due to structural characteristics of the refrigerator door 10. For example, the front panel 20 may be temporarily deformed by the impact, or the plurality of sensors 750 may detect the impact as a user input. Hence, malfunction may occur due to the undesired recognition of the sensor 750.

To prevent the malfunction of the sensor 750 from occurring, in the touch sensor assembly 500, the sensor PCB 700 may be supported by the elastic member 720, and the sensor 750 may be mounted on the sensor PCB 700. The elastic member 720 supports the sensor PCB 700 at a position corresponding to an outer end of the sensor 750 at each of the sides of the sensor due to characteristics in position thereof.

When an area between the plurality of touch parts 12 is pushed, force applied by the user may not be transmitted into the sensor 750, but leak through the elastic member 720. The force applied to the front panel 20 may act on the elastic member 720 to reduce the force transmitted into the sensor 750, thereby preventing the adjacent sensor from recognizing the touch manipulation. The impact occurring when the door 10 is closed may be absorbed and buffered by the elastic member 720 to prevent a pressure transmitted into the sensor 750 from being minimized, thereby preventing the sensor from being mal-operated or malfunctioned. The touch sensor assembly 500 according to an embodiment may prevent the user's erroneous manipulation from occurring through the other structure (described hereinafter) in addition to the above-described structure.

FIG. 25 is an exploded front perspective view of a touch sensor assembly according to another embodiment. A plurality of sensors 750 may be disposed to be spaced a predetermined distance from each other on the sensor PCB 700, and a push support member or buffer 770 may be disposed between the sensors 750. The push support member 770 may be disposed between the front panel 20 and the sensor PCB 700. The push support member 770 may have a height greater than that of the sensor 750.

Even though the user does not push the touch part 12 of the front panel 20, but push an area between the touch parts 12 of the front panel 20, the applied force may be leaked through the push support member 770, and thus the pressure may not be applied to or detected by the sensors 750 disposed on both sides of the push support member 770. The push support member 770 may support the front panel 20 to structurally prevent push deformation of the front panel 20 from occurring, thereby preventing simultaneous recognition of the sensors 750 due to the deformation of the front panel 20 from occurring.

FIG. 26 is a schematic view illustrating a structure of a main component of a touch sensor assembly according to further another embodiment. When the push signals of adjacent touch parts 12 are generated at the same time in the sensor control part 314, the sensor control part 314 may ignore the inputted signal and may not process the push signals. For example, if the variation in quantity of electricity is above a preset quantity occurs from adjacent two sensors 750 at the same time, the sensor control part 314 may determine this state as the erroneous manipulation to ignore the input signal such that control part 314 may not perform the operation based on the manipulation.

FIG. 27 is a schematic view illustrating a structure of a main component of a touch sensor assembly according to further another embodiment, where a dummy sensor 780 may be disposed between plurality of sensors 750. If the user pushes an area between the touch parts 12, the dummy sensor 780 may detect the user's manipulation. When a variation value in quantity of electricity, which occurs in the dummy sensor 780, is greater than those in quantity of electricity, which occurs in other sensors 750, the sensor control part 314 may determine that the user's touch manipulation is erroneous to ignore input signals of other sensors 750. If desired, the sensor control part 314 may display the erroneous manipulation through the display part 11 or output a sound of the erroneous manipulation using the acoustic output device 340. When an erroneous manipulation occurs, the sensor control part 314 may ignore the signal inputted and the user may be given an opportunity to provide a proper input.

An operation of the refrigerator will be described for entering one of a plurality of special modes. In addition to the manipulation for changing various general operational mode or state of the refrigerator, a manipulation or touch inputs may be provided for entering a plurality of special modes may be enabled. The special or configuration modes of the refrigerator may include a sensitivity setting mode for setting manipulation sensitivity of the touch part, an inspection mode for diagnosing an operation state of each component of the refrigerator, a test mode for checking a normal operation of an individual component of an ice maker, and a store display mode for displaying a product in a store to sell the product.

FIGS. 28-31 illustrate the sensitivity setting mode and sensitivity sitting operation of the refrigerator according to an embodiment. When power is applied to the refrigerator 1 to allow the refrigerator to operate, the user may push one of the plurality of touch parts 12 to manipulate an operation of the refrigerator 1. However, force pushed by the user into the touch part 12 may be different, or the preferred intensity in push manipulation may be different. The user may adjust and set a sensitivity of the sensor 750 through a combination of the manipulations of the plurality of touch parts 12 that are originally used for other purposes, such that the sensor 750 can effectively recognize the press of the touch part 12 by the user.

As illustrated in FIG. 29, the user may push a first touch part 12a, which is displayed as "a refrigerating temperature", of the plurality of touch parts 12. When a fifth touch part 12e, which is displayed as "locking release", is pushed three times before a preset time (for example, three seconds) elapses after the first touch part 12a is pushed, the refrigerator enters into the sensitivity setting mode. The manipulation of the fifth touch part 12e that is pushed three times in a row has to be performed within the preset time (for example, three seconds). The preset time is not limited to three seconds as suggested.

After entering the sensitivity setting mode, the display window 11 may be turned off. When the user pushes one of the plurality of touch parts 12a to 12e, that is desired for setting the sensitivity, the current sensitivity of the selected touch part may be displayed. The display window 11 may include two numerical display parts 11a, three symbol display parts 11b, and five touch parts 12a to 12e respectively corresponding to the five display parts 11a and 11b. The five touch parts 12a to 12e can be respectively formed at side positions of the five display parts 11a and 11b.

As illustrated in FIG. 30, after the refrigerator enters the sensitivity setting mode, the user may press the "refrigerating temperature" 12a (first touch part), and then the numerical display part 11a corresponding to the "refrigerating temperature" may flicker or blink to display the current sensitivity of the first touch part 12a in the form of a number, such as 3 shown in FIG. 30. The user may visually not only confirm the current sensitivity of the selected touch part, but also confirm what the currently selected touch part 12 to adjust the sensitivity is.

Alternatively, as illustrated in FIG. 31, after the refrigerator enters into the sensitivity setting mode, the user may press a third touch part 12c that is displayed as "sanitization deodorization", the symbol display part 11b that has a filter shape and is disposed on a side of the third touch part 12c may flicker or blink to show that the third touch part 12c is currently selected for adjustment of sensitivity and the current sensitivity of the third touch part 12c may be displayed on the numerical display part 11a in the form of the number.

As described above, in the state where the user has selected the desired touch part 12 for adjusting the sensitivity, and the current sensitively of the selected touch part is flickering on the numerical display part 11a, the user may repeatedly push the selected touch part 12 to adjust a sensitivity setting value of the selected touch part 12.

For example, as illustrated in FIG. 30, in the state where the current sensitivity setting value of the first touch part 12a is "3", if the first touch part 12a is pushed once more, the sensitivity setting value may further increase by one degree, and the number "4" may be displayed on the numerical display part 11a. Also, the number displayed on the numerical display part 11a increases according to the additionally pushed number of first touch part 12a, and thus, the sensitivity setting value of the first touch part 12a may further increase in degree.

The process for setting the sensitivity may be stored in the host control part 316. When the first touch part 12a is pushed once more in the uppermost sensitivity setting value, the sensitivity setting value may return to the lowermost sensitivity setting value, and then, the number "1" may be displayed on the numerical display part 11a. Here, the lowermost sensitivity setting value that is settable may be greater than a noise level of the sensor 750. Also, as the number is lower, the sensor 750 may sensitively recognize the manipulation of the touch part 12.

The above-described sensitivity setting manipulation has to be performed within a preset time, for example, within three seconds after the last touch part 12 is manipulated. It means that the interval between the previous press and the current press can be set to three seconds. If the preset time elapses, the last selected sensitivity setting value may be stored in the storage part 315, and the sensitivity setting mode may be ended. Also, when the sensitivity setting mode is ended, the display window 11 may return to the normal state in which the operation state of the refrigerator 1 is displayed. The three seconds interval corresponds to an interval between a previous pressing and the current pressing may be up to 3 seconds. For example, after pressing the third touch part 12c, the user may press the touch part 12a within 3 seconds to adjust the sensitivity, and the user may perform the second press within 3 seconds after performing the first pressing. If a user desires to set the sensitivity from 2 to 1 (2→3→4→1) in FIG. 31, the user may press the first touch part 12a within a total of 9 seconds as long as the user presses the touch part 12a within maximally 3 seconds interval. If 3 seconds have elapsed after second pressing, the sensitivity will be set to 4.

The first touch part 12a and the fifth touch part 12e which are manipulated to allow the refrigerator to enter into the sensitivity setting mode may be an example of the combination of the push manipulation for convenience of description. Alternatively, the combination of the manipulation of touch parts may be differently determined. The combined manipulation of the touch parts 12 may be used for the manipulation of the special mode except for the sensitivity setting mode according to the setting method. In other words, the above process may be used for other types of special mode setting rather than the sensitivity mode setting.

FIG. 32 is a view illustrating a process of entering into an inspection mode for the refrigerator according to an embodiment. To enter into the inspection mode during the normal operation of the refrigerator, the fourth touch part 12d that is displayed as "special freezing" is touched. Thereafter, the second touch part 12b that is displayed as a "freezing temperature" is pushed before the end of the preset time (for example, three seconds), such that the refrigerator may enter into the inspection mode. When, the second touch part 12b is pressed, the user may be required to press the touch part 12b for an extended time compared to a normal touch input in order to enter into the inspection mode. When the second touch part 12b is pushed for an extended time to enter into the inspection mode, the user may release the touch of the second touch part 12b to finish the entering manipulation.

The inspection mode may be performed after the refrigerator 1 is manufactured or before the refrigerator 1 is shipped. In the inspection mode, the overall setting of the refrigerator 1 may be confirmed or performed. The fourth touch part 12d and the second touch part 12b may be an example of the combination of the push manipulation for convenience of description. Alternatively, the combination of other touch parts 12 may be set according to the setting method.

Also, the combination of the manipulation of the touch part 12 explained in FIG. 32 may be used for entering into a different special mode, rather than the inspection mode.

FIG. 33 is a view illustrating a process of entering into the test mode in the refrigerator according to an embodiment. To enter into the test mode during the normal operation of the refrigerator, the user touches a fifth touch part 12e that is displayed as "locking release" while the refrigerator door 10 is opened, and then the user pushes the first touch part 12a that is displayed as the "refrigerating temperature" before the preset time (for example, three seconds) elapses, the refrigerator may enter into the test mode. Further, the first touch part 12a may be pressed for an extended time compared to a normal touch input. When the first touch part 12a is pushed for the extended time to enter into the test mode, the user may release the touch of the first touch part 12a to finish the entering manipulation.

In the test mode, when an error occurs during the use of the refrigerator 1, the test mode may be initiated by the user or a service worker to test whether devices of the refrigerator 1 such as an ice maker and dispenser are operating normally.

The fifth touch part 12e and the first touch part 12a which are manipulated to allow the refrigerator to enter into the test mode may be an example of the combination of the push manipulation for convenience of description. Alternatively, the combination of other touch parts 12 may be set according to the setting method.

Also, the combination of the manipulation of the touch part 12 explained in FIG. 33 may be used for entering into a different special mode, rather than the test.

FIG. 34 is a view illustrating a process of entering into a store display mode in the refrigerator according to an embodiment. To enter into the store display mode during the operation of the refrigerator, the user firstly touches the fourth touch part 12d that is displayed as the "special freezing" while the refrigerator door 10 is opened, secondly pushes the first touch part 12a that is displayed as the "refrigerating temperature" before the preset time (for example, second seconds) elapses, and then the refrigerator may enter into the store display mode. Further, the first touch part 12a may be pressed for an extended time compared to a normal touch input. After the first touch part 12a is pushed for the extended time to enter into the store display mode, the user may release the push of the first touch part 12a to finish the entering manipulation.

In the store display mode, an operation state or set state of the refrigerator may change so that the refrigerator is adequate for a display model for operating the refrigerator at a retail store. For example, it may be unnecessary to maintain a temperature within the refrigerator in the store display mode. For example, a defrosting operation may not be required, and operations of a compressor and heater may be maintained in an off state.

The fourth touch part 12d and the first touch part 12a which are manipulated to allow the refrigerator to enter into the store display mode may be an example of the combination of the push manipulation for convenience of description. Alternatively, the combination of other touch parts 12 may be set according to the setting method. Also, the combination of the manipulation of the touch part 12 explain in FIG. 34 may be used for entering into a different special mode, rather than the store display mode.

As described above, the refrigerator according to the embodiments may enter into the various special modes through various methods. The refrigerator according to the embodiments may enter into other special modes in addition to the above-described modes, and manipulation of other touch parts 12 in addition to the above-described touch part 12 may combined with each other.

FIG. 35 is a schematic view illustrating a touch manipulation sensing state in a home appliance including a touch sensor according to a related art.

A portion of an outer appearance of a home appliance according to the related art is defined by an exterior member 2. Also, the external member 2 may have a plate shape formed of a metal material. Also, an adhesive 3 is applied to a rear surface of the exterior member 2. Also, a touch sensor 4 mounted on a sensor PCB 5 to detect a user's touch manipulation pressure may be fixedly mounted on the rear surface of the exterior member by using the adhesive. Thus, when a user pushes the exterior member 2 to perform touch manipulation, the touch sensor 4 may detect the user's touch manipulation to allow the home appliance to operate.

As illustrated in FIG. 35A, even though the exterior member 2 has a thin thickness D1, when the user touches the exterior member 2, the exterior member 2 may be temporarily pushed. When the exterior member 2 is pushed by predetermined force F1 or more, the exterior member 2 may be pushed together with the adhesive 3 to apply a pressure to the touch sensor 4.

Also, when a change in pressure applied to the touch sensor 4 is greater than a preset pressure, the user's touch manipulation may be recognized. That is, when an intensity of a voltage generated by the pressure applied to the touch sensor 4 is greater than a sensible voltage level, it is determined as effective touch manipulation. Thus, the user has to push the exterior member with a specific pressure or more to realize the effective touch manipulation.

As illustrated in FIG. 35B, the exterior member 2 may have a relatively thicker thickness or be formed of a material having high strength as occasion demands. For example, in case of a refrigerator, when an insulation material is provided in a door of which an outer appearance is defined by the exterior member 2, the exterior member 2 may generally have a thickness D2 of about 0.5 mm to prevent the exterior member 2 from being deformed by a foaming pressure. Also, in other home appliances including the refrigerator, the exterior member 2 may have a thickness of about 0.5 mm or more to prevent the exterior member 2 from being crushed or deformed by an external impact or prevent the exterior member 2 from being permanently deformed by repetitive touch manipulation or excessive pushing.

As described above, if the thickness of the exterior member 2 is thicker, when the exterior member 2 is pushed by the force F1 as illustrated in FIG. 35A to perform the touch manipulation, the exterior member 2 may be relatively reduced in size. Also, when the exterior member 2 is deformed in small, the deformation may be absorbed by the elasticity of the adhesive 3. In this case, the intensity of the pressure transmitted to the touch sensor 4 may be significantly reduced.

That is, even though the exterior member 2 is pushed by the force F1 that is the same as that of FIG. 35A, the intensity of the pressure transmitted to the touch sensor 4 may be significantly reduced. Thus, as illustrated in FIG. 35B, the voltage generated in the touch sensor 4 may not reach a level of the voltage detected by the effective touch manipulation, and thus, the recognition of the touch manipulation may be difficult.

To solve the above-described limitation, in the current embodiment, a structure in which the touch sensor 4 is directly attached to the front panel 20 corresponding to the exterior member 2 by the elastic member 720 without using the adhesive 3 may be provided. Also, the touch sensor 4 may be pressed in the direction of the front panel 20 by the elastic member 720 to detect the touch of the touch sensor 4 even though small deformation occurs on the front panel 20, thereby improving the sensitivity of the touch sensor 4.

Hereinafter, this structure will be described in more detail with reference to the accompanying drawings.

FIG. 36 is a schematic view illustrating a touch manipulation sensing state in the touch sensor according to an embodiment.

As illustrated in FIG. 36, the front panel 20 may have a plate or sheet formed of a metal material, which defines at least a portion of the outer appearance of the home appliance. Also, the front panel 20 may have a predetermined thickness D2. The front panel 20 may have a thickness of about 4 mm to about 1.0 mm or more to satisfy conditions of the exterior member of the home appliance including the refrigerator to prevent the exterior member from being deformed by the foaming pressure or from being permanently deformed by the external impact.

A touch part (see reference numeral 12 of FIG. 3) through which the user performs the touch manipulation may be disposed on the front panel 20. The touch part 12 may display a portion on which the touch manipulation is performed on a front surface of the front panel to induce the effective touch manipulation of the user. Alternatively, the induction of the effective touch manipulation may be performed through various surface processing processes such as printing or etching. A window (see reference numeral 11 of FIG. 3) in addition to the touch part 12 may be further provided on the front panel 20. Also, the window 11 together with the touch part 12 may be provided as a module.

A touch sensor 750 mounted on the sensor PCB 700 may be disposed on the rear surface of the front panel 20. The touch sensor 750 may detect the user's touch manipulation. The touch sensor 750 may include a piezoelectric device or a resistive cell type (resistive type) device. In detail, the touch sensor 750 may include the piezoelectric device. Here, the touch may be detected by a change in voltage generated by a pressure which is generated when the touch part 12 of the front panel 20 is touched by the piezoelectric device.

Also, the touch sensor 750 may include the resistive cell type device. Here, a change in pressure may be calculated by using a change in resistance due to the pressure generated when the touch part 12 of the front panel 20 in predetermined current is supplied, and then the touch may be detected through the change in pressure.

The touch sensor 750 may directly contact the touch part 12 of the front panel 20. Thus, the force generated when the user manipulates the touch part 12 may not be lost, but be immediately transmitted to the touch sensor 750.

The touch sensor 750 may be mounted on the sensor PCB 700. Also, a plurality of touch sensors 750 may be mounted on one sensor PCB 700 to respectively correspond to the touch parts 12. Of cause, the sensor PCB 700 may be provided in plurality. Alternatively, at least one or more touch sensors 750 may be mounted on the sensor PBCs 700, respectively.

An elastic member 720 which is capable of pressing the touch sensor 750 may be disposed on the sensor PCB 700. Also, the touch sensor 750 may be closely attached toward the front panel 20 by the elastic member 720. That is, the touch sensor 750 may be closely attached to the rear surface of the front panel 20 as well as pressed toward the front panel 20 by compressive elastic force F2 of the elastic member 720. Thus, the touch sensor 750 may be in a state in which the pressure due to the elastic member 720 is applied. A base voltage of the touch sensor 750 may be applied with a predetermined intensity by the elastic member 720.

As illustrated in FIG. 17, the elastic member 720 may be disposed on one side of the sensor PCB 700 corresponding to the outside of the touch sensor 750. Alternatively, if the touch sensor 750 is capable of being pressed toward the front panel 20, the elastic member 720 may be disposed at various positions. Also, the elastic member 720 may have a shape different from a hexahedral shape. The elastic member 720 may not be limited in shape and material such as a spring. For example, the elastic member 720 may be provided with a different constituent which is capable of pressing the touch sensor 750 toward the front panel.

A detected state of the touch sensor having the above-described structure will be described.

As illustrated in FIG. 36A, in a state in which the front panel 20 is not pushed, the front panel 20 is not deformed. However, since the touch sensor 750 is in the state in which the touch sensor 750 is pressed toward the rear surface of the front panel 20 by the elastic member 720, the touch sensor 750 may have a base voltage with a predetermined intensity.

Here, the base voltage may be due to the elastic force F2 of the elastic member 720. Thus, the base voltage may be set to a voltage less than the sensible voltage of the touch sensor 750. That is, the base voltage may be set to the touch sensor 750 by adjusting the elastic force F2 of the elastic member 720.

In this state, when the user pushes the touch part 12 disposed at a position corresponding to that of the touch sensor 750 of the front panel 20, as illustrated in FIG. 36B, the deformation of the front panel 20 may occur. The deformation of the front panel 20 may be directly transmitted to the touch sensor 750, and the touch sensor 750 may receive the pressure due to the deformation of the front panel 20.

Here, when the front panel 20 is touched, the force F1 pushed by the user may have a direction opposite to that of the compressive elastic force F2 applied to the touch sensor 750 by the elastic member 720. Thus, the bidirectional forces F1 and F2 may be substantially applied to the touch sensor 750, and thus, the touch sensor 750 may be pressed.

That is, when the user pushes the front panel 20 in the state in which the touch sensor 750 is pressed toward the front panel 20 by the elastic member 720, the change in voltage, which occurs by the pressure generated by the user's touch manipulation may be added to the base voltage, and thus a pressure exceeding the sensible voltage level for the touch manipulation may be applied to the touch sensor 750.

Even though the front panel 20 is deformed in small by the user's touch manipulation, the deformation of the front panel 20 may be transmitted as it is to the touch sensor 750 without being lost. In addition, the touch sensor may generate a voltage greater than the sensible voltage level of the touch manipulation even though the touch panel 20 is deformed in small by the compressive elastic force F2 applied by the elastic member 720.

As a result, the sensitivity of the touch sensor 750 may be improved, and thus, the touch sensor 750 may effectively detect the user's touch manipulation in the state in which the front panel 20 has the sufficient strength and thickness D2.

Although the touch sensor 750 operates in the resistive cell manner, the above-described effects may be equally applied. When the elastic member 720 presses the touch sensor 750 in the direction of the touch part 12, a resistance value of the touch sensor 750 may be reduced by the pressing in the state in which predetermined current is applied. Thus, the base voltage may be applied at a predetermined intensity or more due to the reduction of the resistance value.

In this state, when the user touches the touch part 12, a portion of the front panel 20 may be deformed to press the touch sensor 750. Also, the resistance value may be reduced by the additional pressure due to the user's touch, and thus, the voltage may increase to become to the same state as that of FIG. 36B. Therefore, the user's touch manipulation may be effectively detected.

Although the structure in which the touch sensor is disposed on the front panel 20 of the refrigerator 1 is exemplified in the foregoing embodiment, the present disclosure is not limited to the refrigerator. For example, this embodiment may be applied to various home appliances such as washing machines, dishwashers, and cookers, which have a structure in which the touch sensor is attached to a metal panel defining an outer appearance thereof.

The invention claimed is:

1. A refrigerator comprising:
a cabinet that defines a storage space therein; and
a refrigerator door configured to open and close at least a portion of the storage space, the refrigerator door comprising:
a front panel that defines a front outer appearance of the refrigerator door and includes a touch part and a display part, the front panel being made of metal and configured to be deformed by a pressure applied to the touch part,
a touch sensor assembly comprising:
a sensor printed circuit board (PCB) disposed at a rear surface of the front panel and disposed at a position corresponding to the touch part,
a plurality of touch sensors disposed at the sensor PCB and configured to detect the pressure applied to the touch part, each of the plurality of touch sensors comprising a piezo sensor configured to generate a sensor voltage corresponding to an intensity of the pressure, and
an elastic member that contacts a rear surface of the sensor PCB and is configured to press and support the sensor PCB in a direction toward the touch part, the elastic member being configured to generate a base voltage based on the plurality of touch sensors being in a no-touch state, and
a display assembly comprising:
a sensor controller configured to detect the sensor voltage increased from the base voltage in response to a touch operation, and
a display PCB on which the sensor controller is mounted, the display PCB being disposed at a position laterally away from the sensor PCB to thereby minimize an effect of static electricity related to a deformation of the front panel by the pressure,
wherein each of the plurality of touch sensors is configured to, based on the pressure being applied to the touch part by the deformation of the front panel, generate the sensor voltage that is greater than the base voltage, and
wherein the sensor controller is configured to:
recognize an occurrence of the touch operation based on detecting the sensor voltage increased from the base voltage to a voltage that is greater than a preset value, and
based on the plurality of touch sensors simultaneously generating manipulation detecting signals, determine an occurrence of an erroneous manipulation to thereby ignore the manipulation detecting signals.

2. The refrigerator according to claim 1, further comprising a cable connector that electrically connects the sensor PCB and the sensor controller to each other.

3. The refrigerator according to claim 2, wherein the cable connector comprises:
a first cable connector connected to the sensor PCB; and
a second cable connector connected to the display PCB.

4. The refrigerator according to claim 3, wherein the display PCB comprises:
a first side portion disposed adjacent to the touch sensor assembly; and
a second side portion disposed opposite of the first side portion, and
wherein the display assembly further comprises a display terminal disposed on an upper end of the second side portion of the display PCB and connected to the second cable connector.

5. The refrigerator according to claim 1, wherein each of the touch sensors comprises:
- a metal plate that has a circular shape and is configured to be deformed according to the pressure applied to the touch part; and
- a ceramic device attached to the metal plate and configured to generate a variation of the sensor voltage according to the pressure applied to the touch part, the ceramic device having a circular shape, and
- wherein a diameter of the ceramic device is less than a diameter of the metal plate.

6. The refrigerator according to claim 5, wherein the touch sensor assembly further comprises:
- a copper film that is disposed on a surface of the sensor PCB and defines a circuit;
- a spacer attached to the copper film; and
- a conductive foil bonded to the spacer,
- wherein the sensor PCB defines a sensor support that is recessed by a predetermined depth from the sensor PCB and receives the touch sensor assembly, and
- wherein a diameter of the sensor support is less than the diameter of the metal plate such that a circumference of the metal plate is supported by the sensor PCB.

7. The refrigerator according to claim 6, wherein the diameter of the sensor support is greater than the diameter of the ceramic device such that the metal plate is elastically deformed based on the pressure being transmitted to the ceramic device.

8. The refrigerator according to claim 7, wherein the spacer defines a sensor hole that receives one of the plurality of touch sensors without interference with the spacer.

9. The refrigerator according to claim 8, wherein the conductive foil covers the spacer and the ceramic device.

10. The refrigerator according to claim 9, wherein the elastic member is provided to each of the plurality of touch sensors, the elastic member comprising:
- a first elastic member spaced apart from an edge of the sensor support; and
- a second elastic member that is spaced apart from the edge of the sensor support and faces the first elastic member.

* * * * *